United States Patent
Jiang et al.

(10) Patent No.: US 10,949,041 B2
(45) Date of Patent: Mar. 16, 2021

(54) CAPACITANCE DETECTION CIRCUIT, CAPACITANCE DETECTION METHOD, TOUCH DETECTION APPARATUS, AND TERMINAL DEVICE

(71) Applicant: SHENZHEN GOODIX TECHNOLOGY CO., LTD., Shenzhen (CN)

(72) Inventors: Hong Jiang, Shenzhen (CN); Guanjun Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 253 days.

(21) Appl. No.: 16/179,879

(22) Filed: Nov. 2, 2018

(65) Prior Publication Data

US 2019/0079124 A1    Mar. 14, 2019

Related U.S. Application Data

(63) Continuation of application No. PCT/CN2017/101227, filed on Sep. 11, 2017.

(51) Int. Cl.
*G06F 3/044* (2006.01)
*G06F 3/041* (2006.01)
(Continued)

(52) U.S. Cl.
CPC ........... *G06F 3/0445* (2019.05); *G01D 5/241* (2013.01); *G01R 27/2605* (2013.01); *G06F 3/0412* (2013.01); *G06F 3/04166* (2019.05)

(58) Field of Classification Search
CPC ............ G01R 27/2605; G06F 3/04166; G06F 3/0412; G06F 3/044; G06F 3/0445;
(Continued)

(56) References Cited

U.S. PATENT DOCUMENTS 9,557,721 B2  1/2017  Nakajima et al.
9,587,964 B2  3/2017  Curtis
(Continued)

FOREIGN PATENT DOCUMENTS

CN    101858941 A    10/2010
CN    102087318 A    6/2011
(Continued)

OTHER PUBLICATIONS

Programmable Gain Amplifier, available at https://web.archive.org/web/20161113040308/https://en.wikipedia.org/wiki/Programmable-gain_amplifier_on Nov. 13, 2016 (Year: 2016).*

*Primary Examiner* — Daniel R Miller

(57) ABSTRACT

Provided are a capacitance detection circuit (200). The capacitance detection circuit (200) is used for detecting capacitances of N capacitors to be detected, and includes: a reference capacitor, at least N−1 first front end circuits (210) for converting capacitance signals of the capacitors to be detected into first voltage signals and performing differencing on the first voltage signals, at least one second front end circuit (220) for converting capacitance signals of a capacitor to be detected and a reference capacitor into second voltage signals and performing differencing on the second voltage signals, and a processing circuit (230); and the processing circuit (230) determines a capacitance value of each of the N capacitors to be detected according to a first differential signal output by each of the first front end circuits (210) and a second differential signal output by each of the second front end circuits (220).

20 Claims, 10 Drawing Sheets

(51) Int. Cl.
*G01R 27/26* (2006.01)
*G01D 5/241* (2006.01)

(58) Field of Classification Search
CPC . G06F 2203/04101; G06F 2203/04108; G06F 2203/04114; G06F 2203/04111; G06F 2203/04112; G01D 5/241
See application file for complete search history.

(56) References Cited

U.S. PATENT DOCUMENTS

| | | | |
|---|---|---|---|
| 2005/0122785 A1* | 6/2005 | Umeda | G06F 3/044 365/187 |
| 2010/0307840 A1 | 12/2010 | Kobayashi et al. | |
| 2011/0187390 A1 | 8/2011 | Lin et al. | |
| 2013/0141372 A1* | 6/2013 | Kang | G06F 3/0416 345/173 |
| 2014/0002115 A1 | 1/2014 | Lin et al. | |
| 2014/0046460 A1 | 2/2014 | Nakajima et al. | |
| 2014/0368222 A1 | 12/2014 | Curtis | |
| 2015/0062040 A1* | 3/2015 | Park | G06F 3/0446 345/173 |
| 2015/0301682 A1 | 10/2015 | Kanazawa et al. | |
| 2016/0306465 A1* | 10/2016 | Ahn | G06F 3/044 |
| 2017/0205933 A1* | 7/2017 | Kwon | G06F 3/044 |
| 2017/0357375 A1* | 12/2017 | Mori | G06F 3/0418 |
| 2018/0018028 A1* | 1/2018 | Lee | G06F 3/044 |

FOREIGN PATENT DOCUMENTS

| | | |
|---|---|---|
| CN | 103577019 A | 2/2014 |
| CN | 106885948 A | 6/2017 |
| CN | 206440771 U | 8/2017 |
| CN | 107449810 A | 12/2017 |

* cited by examiner

300

---

Each of at least N-1 first front end circuits converts capacitance signals of two connected capacitors to be detected into first voltage signals, and performs differencing on the first voltage signals of the two connected capacitors to be detected, to obtain a first differential signal of voltages corresponding to the two connected capacitors to be detected. ~310

Each of at least one second front end circuit converts capacitance signals of a connected capacitor to be detected and a connected reference capacitor into second voltage signals, and performs differencing on the second voltage signal of the connected capacitor to be detected and the second voltage signal of the connected reference capacitor, to obtain a second differential signal of voltages corresponding to the connected capacitor to be detected and the connected reference capacitor. ~320

A processing circuit determines a capacitance value of each of N capacitors to be detected according to the first differential signal obtained by each of the first front end circuits and the second differential signal obtained by each of the second front end circuits. ~330

CAPACITANCE DETECTION CIRCUIT, CAPACITANCE DETECTION METHOD, TOUCH DETECTION APPARATUS, AND TERMINAL DEVICE

CROSS-REFERENCE TO RELATED APPLICATIONS

The present disclosure is a continuation of international application No. PCT/CN2017/101227, filed on Sep. 11, 2017, which is hereby incorporated by reference in its entireties.

TECHNICAL FIELD

The present application relates to the field of capacitance detection technologies, and in particular, to a capacitance detection circuit, a capacitance detection method, a touch detection apparatus, and a terminal device.

BACKGROUND

Capacitors are widely applied to numerous electronic terminal devices, such as a touch control sensor for touch control on a display screen of the terminal device. In a process of using a capacitor, it is indispensable to measure and analyze a capacitance value thereof. Nowadays, self-capacitance detection has become a very important measurement and analysis method.

However, since a self-capacitance tends to be relatively great, an existing self-capacitance detection method has lower sensitivity when the self-capacitance is greater; and a volume of a cancel capacitor for improving the sensitivity is larger, so that the cancel capacitor cannot be integrated, and is also excessively high in cost; and further, an increase in self-capacitance causes the sensitivity of the existing self-capacitance detection method to be lower, such that the capacitance value cannot be correctly detected. Therefore, how to improve the sensitivity of self-capacitance detection and accurately detect the capacitance value within a controllable cost range is an urgent problem to be solved.

SUMMARY

Embodiments of the present application provide a capacitance detection circuit, a capacitance detection method, a touch detection apparatus, and a terminal device, which can not only resolve a problem of capacitance detection when a self-capacitance is greater that cannot be resolved by an existing solution, but also improve sensitivity of the capacitance detection.

In a first aspect, an embodiment of the present application provides a capacitance detection circuit for detecting capacitances of N capacitors to be detected, the N being greater than or equal to 2, where the capacitance detection circuit includes:

a reference capacitor, at least N−1 first front end circuits for converting capacitance signals of the capacitors to be detected into first voltage signals and performing differencing on the first voltage signals, at least one second front end circuit for converting capacitance signals of a capacitor to be detected and a reference capacitor into second voltage signals and performing differencing on the second voltage signals, and a processing circuit, where each of the at least N−1 first front end circuits includes a first input end and a second input end, and each of the at least one second front end circuit includes a third input end and a fourth input end;

a first input end and a second input end of each of at least N−2 first front end circuits are respectively connected to two different capacitors to be detected;

a first input end of a first front end circuit except the at least N−2 first front end circuits is simultaneously connected to a third input end of a second front end circuit and a capacitor to be detected, a second input end of the first front end circuit except the at least N−2 first front end circuits is simultaneously connected to a first input end of a first front end circuit of the at least N−2 first front end circuits and a capacitor to be detected, and the capacitors to be detected to which the two input ends of the first front end circuit except the at least N−2 first front end circuits are connected are different capacitors to be detected;

a third input end of each of the at least one second front end circuit is connected to a capacitor to be detected, and a fourth input end of each of the at least one second front end circuit is connected to a reference capacitor;

each of the at least N−1 first front end circuits outputs a first differential signal of voltages corresponding to two connected capacitors to be detected;

each of the at least one second front end circuit outputs a second differential signal of voltages corresponding to a connected capacitor to be detected and a connected reference capacitor; and the processing circuit is connected to output ends of each of the first front end circuits and each of the second front end circuits, and is configured to determine, according to the first differential signal output by each of the first front end circuits and the second differential signal output by each of the second front end circuits, a capacitance value of each of the N capacitors to be detected.

Therefore, in a capacitance detection circuit of an embodiment of the present application, a first front end circuit outputs, to a processing circuit, a first differential signal of voltages corresponding to two connected capacitors to be detected, and a second front end circuit outputs, to the processing circuit, a second differential signal of voltages corresponding to a connected capacitor to be detected and a connected reference capacitor, which is a differencing process; the processing circuit determines, according to the first differential signal received from the first front end circuit and the second differential signal received from the second front end circuit, a capacitance value of each of N capacitors to be detected, which is a recovery process. Sensitivity of capacitance detection could be improved by means of differential followed by recovery without substantively increasing costs.

Optionally, in an implementation manner of the first aspect, the first front end circuit includes a first control circuit and a first programmable gain amplifier (PGA) circuit, where the first control circuit is connected to a DC voltage source, two capacitors to be detected to which the first front end circuit is connected, and the first PGA circuit;

the first control circuit is configured to control the DC voltage source to charge the two capacitors to be detected to which the first front end circuit is connected, and control discharge of the two capacitors to be detected to which the first front end circuit is connected; and the first PGA circuit is configured to convert, when the two capacitors to be detected to which the first front end circuit is connected discharge, capacitance signals of the capacitors to be detected into first voltage signals, and perform differencing on the first voltage signals of the two connected capacitors to be detected, to obtain a first differential signal of voltages corresponding to the two capacitors to be detected to which the first front end circuit is connected;

or the first front end circuit includes a first conversion circuit and a second PGA circuit, where the first conversion circuit is connected to a driving voltage source, two capacitors to be detected to which the first front end circuit is connected, and the second PGA circuit;

the first conversion circuit is configured to convert capacitance signals of the two capacitors to be detected to which the first front end circuit is connected into first voltage signals; and the second PGA circuit is configured to acquire, from the first conversion circuit, the first voltage signals corresponding to the two capacitors to be detected to which the first front end circuit is connected, and perform differencing on the first voltage signals of the two connected capacitors to be detected, to obtain a first differential signal of voltages corresponding to the two capacitors to be detected to which the first front end circuit is connected.

Optionally, in an implementation manner of the first aspect, the first control circuit includes a first switch group and a second switch group, the first switch group is connected to the DC voltage source and the two capacitors to be detected to which the first front end circuit is connected, and the second switch group is connected to the two capacitors to be detected to which the first front end circuit is connected and the first PGA circuit, where when the first switch group is in a closed state and the second switch group is in an open state, the DC voltage source charges the two capacitors to be detected to which the first front end circuit is connected; and when the second switch group is in a closed state and the first switch group is in an open state, the two capacitors to be detected to which the first front end circuit is connected discharge to the first PGA circuit.

Optionally, in an implementation manner of the first aspect, the first conversion circuit includes a first voltage division resistor and a second voltage division resistor, where the first voltage division resistor is connected to the driving voltage source, the second PGA circuit, and one of the two capacitors to be detected to which the first front end circuit is connected; and the second voltage division resistor is connected to the driving voltage source, the second PGA circuit, and the other of the two capacitors to be detected to which the first front end circuit is connected.

Optionally, in an implementation manner of the first aspect, the second front end circuit includes a second control circuit and a third PGA circuit, where the second control circuit is connected to a DC voltage source, the third PGA circuit, a capacitor to be detected and a reference capacitor to which the second front end circuit is connected;

the second control circuit is configured to control the DC voltage source to charge the capacitor to be detected and the reference capacitor to which the second front end circuit is connected, and control discharge of the capacitor to be detected and the reference capacitor to which the second front end circuit is connected; and the third PGA circuit is configured to convert, when the capacitor to be detected and the reference capacitor to which the second front end circuit is connected discharge, capacitance signals of the capacitor to be detected and the reference capacitor into second voltage signals, and perform differencing on the second voltage signals of the connected capacitor to be detected and the connected reference capacitor, to obtain a second differential signal of voltages corresponding to the capacitor to be detected and the reference capacitor to which the second front end circuit is connected;

or the second front end circuit includes a second conversion circuit and a fourth PGA circuit, where the second conversion circuit is connected to a driving voltage source, the fourth PGA circuit, and a capacitor to be detected and a reference capacitor to which the second front end circuit is connected;

the second conversion circuit is configured to convert capacitance values of the capacitor to be detected and the reference capacitor to which the second front end circuit is connected into voltage values; and the fourth PGA circuit is configured to acquire, from the second conversion circuit, second voltage signals corresponding to the capacitor to be detected and the reference capacitor to which the second front end circuit is connected, and perform differencing on the second voltage signals of the connected capacitor to be detected and the connected reference capacitor, to obtain a second differential signal of voltages corresponding to the capacitor to be detected and the reference capacitor to which the second front end circuit is connected.

Optionally, in an implementation manner of the first aspect, the second control circuit includes a third switch group and a fourth switch group, the third switch group is connected to the DC voltage source and the capacitor to be detected and the reference capacitor to which the second front end circuit is connected, and the fourth switch group is connected to the third PGA circuit and the capacitor to be detected and the reference capacitor to which the second front end circuit is connected, where when the third switch group is in a closed state and the fourth switch group is in an open state, the DC voltage source charges the capacitor to be detected and the reference capacitor to which the second front end circuit is connected; and when the fourth switch group is in a closed state and the third switch group is in an open state, the capacitor to be detected and the reference capacitor to which the second front end circuit is connected discharge to the third PGA circuit.

Optionally, in an implementation manner of the first aspect, the second conversion circuit includes a third voltage division resistor and a fourth voltage division resistor, where the third voltage division resistor is connected to the driving voltage source, the fourth PGA circuit, and the capacitor to be detected to which the second front end circuit is connected; and the fourth voltage division resistor is connected to the driving voltage source, the fourth PGA circuit, and the reference capacitor to which the second front end circuit is connected.

Optionally, in an implementation manner of the first aspect, the first front end circuit includes a first filter circuit and/or a first integration circuit, where the first filter circuit is configured to filter an interference signal in a first differential signal of voltages corresponding to two connected capacitors to be detected output by the first front end circuit; and the first integration circuit is configured to perform integration and amplification processing on the first differential signal of the voltages corresponding to the two connected capacitors to be detected output by the first front end circuit.

Optionally, in an implementation manner of the first aspect, the second front end circuit includes a second filter circuit and/or a second integration circuit, where the second filter circuit is configured to filter an interference signal in a second differential signal of voltages corresponding to a connected capacitor to be detected and a connected reference capacitor output by the second front end circuit; and the second integration circuit is configured to perform integration and amplification processing on the second differential signal of the voltages corresponding to the connected capacitor to be detected and the connected reference capacitor output by the second front end circuit.

Optionally, in an implementation manner of the first aspect, the first input end is a positive input end, the second input end is a negative input end, and the third input end is a positive input end and the fourth input end is a negative input end.

In a second aspect, an embodiment of the present application provides a capacitance detection method, including the capacitance detection circuit of the first aspect, and the method includes:

converting, by each of at least N−1 first front end circuits, capacitance signals of two connected capacitors to be detected into first voltage signals, and performing differencing on the first voltage signals of the two connected capacitors to be detected, to obtain a first differential signal of voltages corresponding to the two connected capacitors to be detected;

converting, by each of at least one second front end circuit, capacitance signals of a connected capacitor to be detected and a connected reference capacitor into second voltage signals, and performing differencing on the second voltage signal of the connected capacitor to be detected and the second voltage signal of the connected reference capacitor, to obtain a second differential signal of voltages corresponding to the connected capacitor to be detected and the connected reference capacitor; and determining, by a processing circuit according to the first differential signal obtained by each of the first front end circuits and the second differential signal obtained by each of the second front end circuits, a capacitance value of each of N capacitors to be detected.

Therefore, in a capacitance detection method of an embodiment of the present application, a first front end circuit outputs, to a processing circuit, a first differential signal of voltages corresponding to two connected capacitors to be detected, and a second front end circuit outputs, to the processing circuit, a second differential signal of voltages corresponding to a connected capacitor to be detected and a connected reference capacitor, which is a differencing process; the processing circuit determines, according to the first differential signal received from the first front end circuit and the second differential signal received from the second front end circuit, a capacitance value of each of N capacitors to be detected, which is a recovery process.

Sensitivity of capacitance detection could be improved by means of differencing followed by recovery without substantively increasing costs.

Optionally, in an implementation manner of the second aspect, the first front end circuit includes a first control circuit and a first programmable gain amplifier (PGA) circuit, and the first control circuit is connected to a DC voltage source, two capacitors to be detected to which the first front end circuit is connected, and the first PGA circuit;

the converting, by each of the at least N−1 first front end circuits, the capacitance signals of the two connected capacitors to be detected into the first voltage signals, and performing differencing on the first voltage signals of the two connected capacitors to be detected, to obtain the first differential signal of the voltages corresponding to the two connected capacitors to be detected, includes:

controlling, by the first control circuit, the DC voltage source to charge the two capacitors to be detected to which the first front end circuit is connected, and after charging the two capacitors to be detected to which the first front end circuit is connected, controlling discharge of the two capacitors to be detected to which the first front end circuit is connected; and converting, by the first PGA circuit, when the two capacitors to be detected to which the first front end circuit is connected discharge, capacitance signals of the capacitors to be detected into first voltage signals, and performing differencing on the first voltage signals of the two connected capacitors to be detected, to obtain a first differential signal of voltages corresponding to the two capacitors to be detected to which the first front end circuit is connected.

Optionally, in an implementation manner of the second aspect, the first control circuit includes a first switch group and a second switch group;

the controlling, by the first control circuit, the DC voltage source to charge the two capacitors to be detected to which the first front end circuit is connected, and after charging the two capacitors to be detected to which the first front end circuit is connected, controlling the discharge of the two capacitors to be detected to which the first front end circuit is connected, includes:

when the first switch group is in a closed state and the second switch group is in an open state, the DC voltage source charges the two capacitors to be detected to which the first front end circuit is connected; and when the second switch group is in a closed state and the first switch group is in an open state, the two capacitors to be detected to which the first front end circuit is connected discharge to the first PGA circuit.

Optionally, in an implementation manner of the second aspect, the first front end circuit includes a first conversion circuit and a second PGA circuit, and the first conversion circuit is connected to a driving voltage source, two capacitors to be detected to which the first front end circuit is connected, and the second PGA circuit;

the converting, by each of the at least N−1 first front end circuits, the capacitance signals of the two connected capacitors to be detected into the first voltage signals, and performing differencing on the first voltage signals of the two connected capacitors to be detected, to obtain the first differential signal of the voltages corresponding to the two connected capacitors to be detected, includes:

converting, by the first conversion circuit, capacitance signals of two capacitors to be detected to which the first front end circuit is connected into first voltage signals; and acquiring, by the second PGA circuit from the first conversion circuit, the first voltage signals corresponding to the two capacitors to be detected to which the first front end circuit is connected, and performing differencing on the first voltage signals of the two connected capacitors to be detected, to obtain a first differential signal of voltages corresponding to the two capacitors to be detected to which the first front end circuit is connected.

Optionally, in an implementation manner of the second aspect, the second front end circuit includes a second control circuit and a third PGA circuit, and the second control circuit is connected to a DC voltage source, the third PGA circuit, a capacitor to be detected and a reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, includes:

controlling, by the second control circuit, the DC voltage source to charge the capacitor to be detected and the reference capacitor to which the second front end circuit is connected, and after charging the capacitor to be detected and the reference capacitor to which the second front end circuit is connected, controlling discharge of the capacitor to be detected and the reference capacitor to which the second front end circuit is connected; and converting, by the third PGA circuit, when the capacitor to be detected and the reference capacitor to which the second front end circuit is connected discharge, capacitance signals of the connected capacitor to be detected and the connected reference capacitor into second voltage signals, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

Optionally, in an implementation manner of the second aspect, the second control circuit includes a third switch group and a fourth switch group;

the controlling, by the second control circuit, the DC voltage source to charge the capacitor to be detected and the reference capacitor to which the second front end circuit is connected, and after charging the capacitor to be detected and the reference capacitor to which the second front end circuit is connected, controlling the discharge of the capacitor to be detected and the reference capacitor to which the second front end circuit is connected, includes:

when the third switch group is in a closed state and the fourth switch group is in an open state, the DC voltage source charges the capacitor to be detected and the reference capacitor to which the second front end circuit is connected; and when the fourth switch group is in a closed state and the third switch group is in an open state, the capacitor to be detected and the reference capacitor to which the second front end circuit is connected discharge to the third PGA circuit.

Optionally, in an implementation manner of the second aspect, the second front end circuit includes a second conversion circuit and a fourth PGA circuit, and the second conversion circuit is connected to a driving voltage source, the fourth PGA circuit, and a capacitor to be detected and a reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, includes:

converting, by the second conversion circuit, capacitance signals of the capacitor to be detected and the reference capacitor to which the second front end circuit is connected into second voltage signals; and acquiring, by the fourth PGA circuit from the second conversion circuit, the second voltage signals corresponding to the capacitor to be detected and the reference capacitor to which the second front end circuit is connected, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

In a third aspect, an embodiment of the present application provides a touch detection apparatus including: the capacitance detection circuit according to the first aspect or any one of the optionally implementation manners of the first aspect, where the touch detection apparatus determines a touch position of a user according to a capacitance value of each of N capacitors to be detected determined by the capacitance detection circuit.

In a fourth aspect, an embodiment of the present application provides a terminal device, including the touch detection apparatus according to the third aspect.

Therefore, according to a terminal device in an embodiment of the present application, the terminal device includes a touch detection apparatus, and the touch detection apparatus may determine a touch position of a user according to capacitance values of N capacitors to be detected processed by a capacitance detection circuit by means of differencing followed by recovery. Thus, when the touch detection apparatus accurately determines the touch position of the user on the touch detection apparatus, the terminal device may accurately identify the touch position acquired by the touch detection apparatus, thereby improving touch control sensitivity, and optimizing an existing self-capacitance detection device.

BRIEF DESCRIPTION OF DRAWINGS

FIG. 11 is a schematic flowchart of a capacitance detection method according to an embodiment of the present application.

DESCRIPTION OF EMBODIMENTS

The technical solutions in embodiments of the present application will be described hereinafter with reference to the accompanying drawings.

For ease of understanding, a capacitive touch control system using self-capacitance detection in the prior art will be described hereinafter with reference to FIG. 1.

Figure 1:
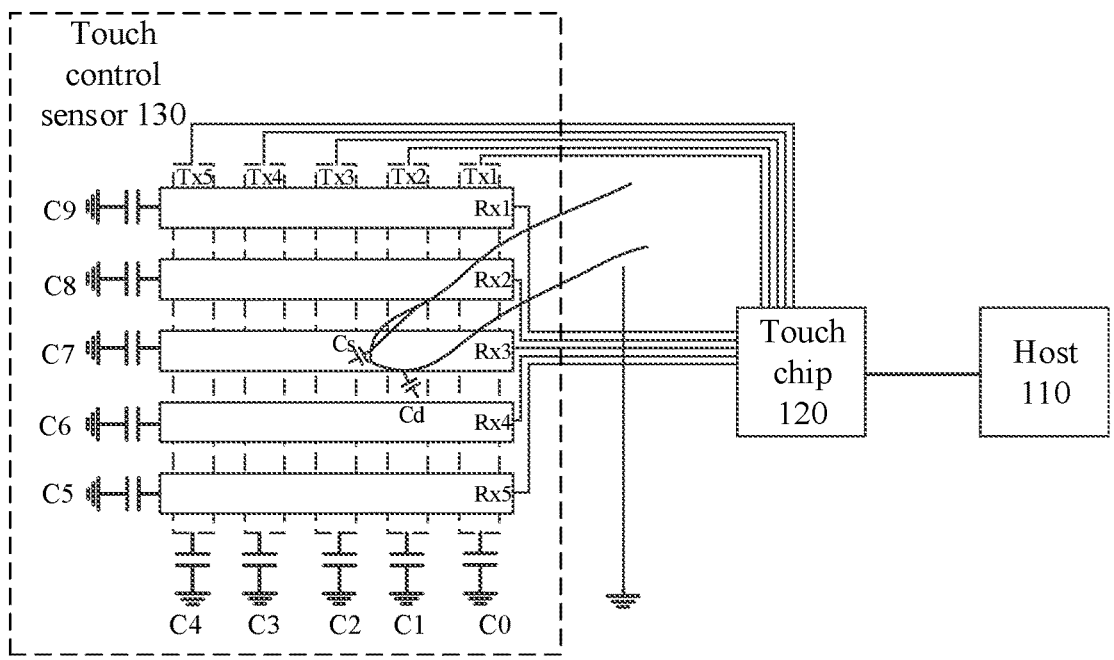
FIG. 1 is a schematic diagram of a capacitive touch control system using a capacitance detection circuit according to an embodiment of the present application.

As shown in FIG. 1, a capacitive touch control system includes a Host 110, a touch integrated circuit (Touch IC) 120, and a touch control sensor 130. The touch control sensor 130 includes a Tx layer and an Rx layer; the Tx layer includes a TX1 channel, a Tx2 channel, a Tx3 channel, a Tx4 channel, and a Tx5 channel; and the Rx layer includes an Rx1 channel, an Rx2 channel, an Rx3 channel, an Rx4 channel, and an Rx5 channel. In the Tx layer, capacitances to ground of the Tx1 channel, the Tx2 channel, the Tx3 channel, the Tx4 channel, and the Tx5 channel are C0, C1, C2, C3, and C4, respectively; and in the Rx layer, capacitances to ground of the Rx1 channel, the Rx2 channel, the Rx3 channel, and the Rx4 and the Rx5 channel are C9, C8, C7, C6, C5, respectively.

Each of the Tx channels in the touch control sensor 130 is respectively connected to the Touch IC 120, and each of the Rx channels is respectively connected to the Touch IC 120. The Touch IC 120 is connected to the Host 110 and can communicate with the Host 110.

It should be understood that, upon self-capacitance detection, a change of a capacitance to ground of each channel (Tx layers and Rx layers) electrode is detected.

Specifically, the touch IC 120 scans the change of the capacitance to ground of each of the Tx channels and the Rx channels in the touch control sensor 130. When a finger is approached, a self-capacitance of a channel near the finger becomes greater, the finger and a Tx channel generate a Cd capacitance, and the finger and an Rx channel generate a Cs capacitance; since a human body is conductive and is connected to ground, a self-capacitance of the Tx2 channel touched and controlled by the finger changes from C1 to C1+Cd, and a self-capacitance of the Rx3 channel changes from C7 to C7+Cs; and therefore, a position touched by the finger can be calculated as long as the Touch IC 120 detects the change of the self-capacitance of the channel.

Since a capacitance value of the self-capacitance is relatively great, and the amount of change caused by the touch control of the finger is relatively small, an existing self-capacitance detection method has a problem of low touch control sensitivity. Increasing the number of cancel capacitors can improve the touch control sensitivity, however, the cancel capacitors cannot be integrated into a chip because of requiring too great cancel capacitance and too many cancel capacitors, and there is a problem of excessively high costs. In some scenarios of greater capacitance to ground, for example, on a touch control display in a Samsung Galaxy Note 7, a user data center (SDC) uses a Y-OCTA technology, and in a touch display screen based on the Y-OCTA technology, a capacitance to ground of each capacitance channel is greatly increased, it is difficult for the Touch IC 120 to detect the change of the self-capacitance of the channel caused by a touch of the finger, and the touch position of the finger cannot be calculated.

Therefore, embodiments of the present application provide a solution and circuit for differencing followed by recovery, which can overcome an influence of a great self-capacitance on self-capacitance detection and improve sensitivity of the self-capacitance detection.

Hereinafter, a capacitance detection circuit according to an embodiment of the present application will be described in detail with reference to FIG. 2 to FIG. 10.

Figure 2:
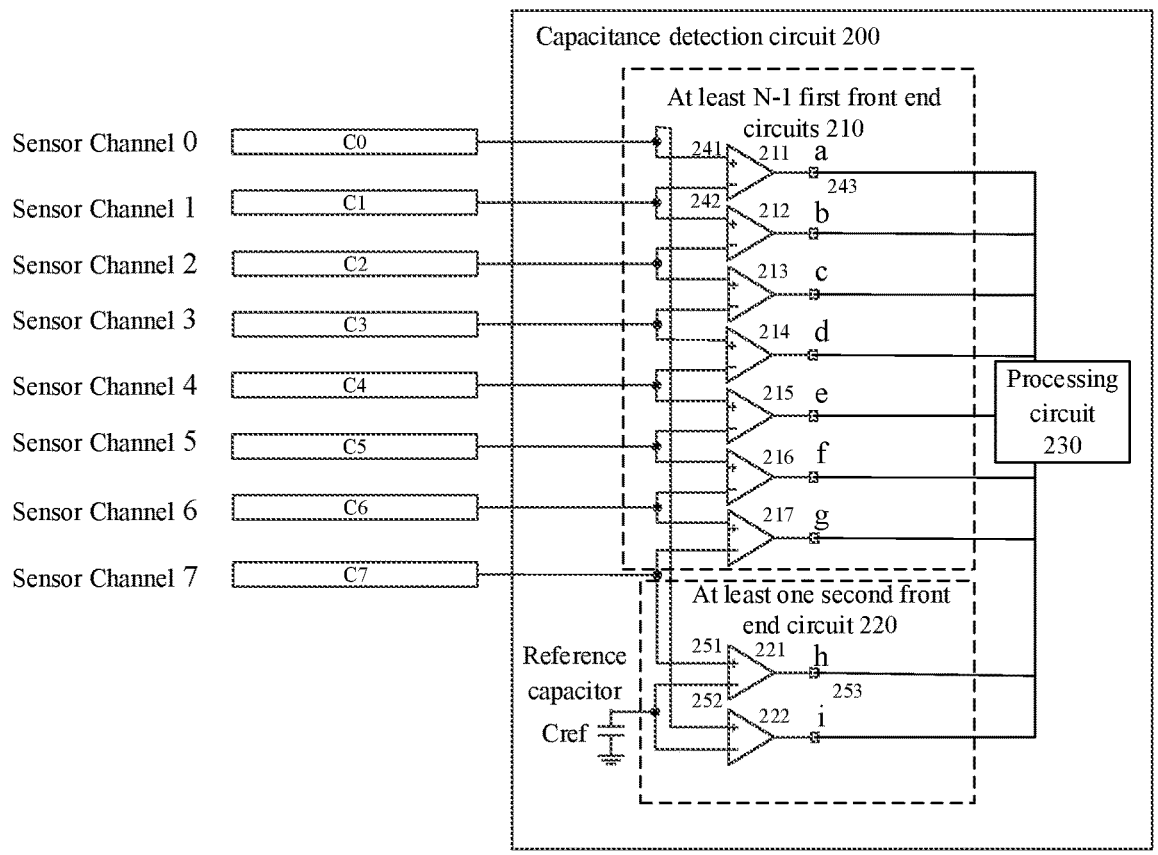
FIG. 2 is a schematic circuit diagram using a capacitance detection circuit according to an embodiment of the present application.

FIG. 2 is a schematic structural diagram of a capacitance detection circuit 200 according to an embodiment of the present application.

As shown in FIG. 2, the capacitance detection circuit 200 is configured to detect capacitances of N capacitors to be detected, the N is greater than or equal to 2, and the capacitance detection circuit 200 includes: a reference capacitor, at least N−1 first front end circuits 210 for converting capacitance signals of the capacitors to be detected into first voltage signals and performing differencing on the first voltage signals, at least one second front end circuit 220 for converting capacitance signals of a capacitor to be detected and a reference capacitor into second voltage signals and performing differencing on the second voltage signals, and a processing circuit 230.

Optionally, each of the at least N−1 first front end circuits outputs a first differential signal of voltages corresponding to two connected capacitors to be detected;

each of the at least one second front end circuit outputs a second differential signal of voltages corresponding to a connected capacitor to be detected and a connected reference capacitor; and the processing circuit is connected to output ends of each of the first front end circuits and each of the second front end circuits, and is configured to determine, according to the first differential signal output by each of the first front end circuits and the second differential signal output by each of the second front end circuits, a capacitance value of each of the N capacitors to be detected.

Optionally, the processing circuit 230 may be a digital process block.

It should be understood that, the processing circuit 230 has operation and storage functions.

Optionally, the processing circuit may have a demodulation function, that is, an ability to demodulate a signal.

It should be understood that, the first differential signal output by the first front end circuit and the second differential signal output by the second front end circuit that are received by the processing circuit are analog-to-digital converted signals.

For example, analog to digital conversion of the first differential signal and the second differential signal may be implemented by an analog to digital conversion (ADC) circuit.

Optionally, the processing circuit 230 may also implement a function of calibrating a coordinate of the touch position of the user on the basis of determining a capacitance value of each of the N capacitors to be detected.

Optionally, each of the at least N−1 first front end circuits 210 includes a first input end and a second input end.

Optionally, the first input end is a positive input end, the second input end is a negative input end.

Optionally, in the at least N−1 first front end circuits 210, the capacitors to be detected to which the first input ends of any two of the first front end circuits are connected are different, and the capacitors to be detected to which the second input ends of any two of the first front end circuits are connected are different.

It should be understood that, the capacitor to be detected to which the first front end circuit is connected means that the first front end circuit is electrically connected to the capacitor to be detected, and the first front end circuit may acquire a capacitance signal of the connected capacitor to be detected.

Optionally, each of the at least one second front end circuit 220 includes a third input end and a fourth input end.

Optionally, the third input end is a positive input end and the fourth input end is a negative input end.

It should be understood that, the capacitor to be detected and the reference capacitor to which the second front end circuit is connected means that the second front end circuit is electrically connected to the capacitor to be detected and the reference capacitor, and the second front end circuit may acquire capacitance signals of the connected capacitor to be detected and the connected reference capacitor.

Optionally, a first input end and a second input end of each of at least N−2 first front end circuits are respectively connected to two different capacitors to be detected.

Optionally, a first input end of a first front end circuit except the at least N−2 first front end circuits is simultaneously connected to a capacitor to be detected and a third input end of a second front end circuit, a second input end of the first front end circuit except the at least N−2 first front end circuits is simultaneously connected to a capacitor to be detected and a first input end of a first front end circuit of the at least N−2 first front end circuits, and the capacitors to be detected to which the two input ends of the first front end circuit except the at least N−2 first front end circuits are connected are different capacitors to be detected.

Optionally, a third input end and a fourth input end of each of the at least one second front end circuit are connected to two different capacitors to be detected, respectively.

Optionally, capacitors to be detected to which third input ends of any two of the at least one second front end circuits are connected are different.

It should be understood that, the number of the first front end circuits, the number of the second front end circuits, the number of the capacitors to be detected and the number of the reference capacitors in FIG. 2 are merely examples, and the specific numbers are determined according to actual requirements, which are not limited in the embodiment of the present application.

Optionally, each of the N capacitors to be detected is a capacitor formed by an electrode of a touch channel and ground.

For example, as shown in FIG. 2, N=8, the capacitance detection circuit 200 includes: 7 first front end circuits, respectively denoted as 211-217; 2 second front end circuits, denoted as 221 and 222; and 8 capacitors to be detected, denoted as a Sensor Channel 0, a Sensor Channel 1, a Sensor Channel 2, a Sensor Channel 3, a Sensor Channel 4, a Sensor Channel 5, a Sensor Channel 6 and a Sensor Channel 7. Capacitance signals of the 8 capacitors to be detected are denoted as C0, C1, C2, C3, C4, C5, C6 and C7; and a capacitance signal of the reference capacitor is denoted as Cref.

The first front end circuit 211 is connected to the Sensor Channel 0 and the Sensor Channel 1, the first front end circuit 212 is connected to the Sensor Channel 1 and the Sensor Channel 2, the first front end circuit 213 is connected to the Sensor Channel 2 and the Sensor Channel 3, the first front end circuit 214 is connected to the Sensor Channel 3 and Sensor Channel 4, the first front end circuit 215 is connected to the Sensor Channel 4 and the Sensor Channel 5, the first front end circuit 216 is connected to the Sensor Channel 5 and the Sensor Channel 6, and the first front end circuit 217 is connected to the Sensor Channel 6 and the Sensor Channel 7. The second front end circuit 221 is connected to the Sensor Channel 7 and the reference capacitor, and the second front end circuit 222 is connected to the Sensor Channel 0 and the reference capacitor.

The first front end circuit 211 is configured to output a first differential signal a of voltages corresponding to the Sensor Channel 0 and the Sensor Channel 1, (V0−V1=a); the first front end circuit 212 is configured to output a first differential signal b of voltages corresponding to the Sensor Channel 1 and the Sensor Channel 2, (V1−V2=b); the first front end circuit 213 is configured to output a first differential signal c of voltages corresponding to the Sensor Channel 3 and the Sensor Channel 2, (V2−V3=c); the front end circuit 214 is configured to output a first differential signal d of voltages corresponding to the Sensor Channel 4 and the Sensor Channel 3, (V3−V4=d); the first front end circuit 215 is configured to output a first differential signal e of voltages corresponding to the Sensor Channel 5 and the Sensor Channel 4, (V4−V5=e); the first front end circuit 216 is configured to output a first differential signal f of voltages corresponding to the Sensor Channel 6 and the Sensor Channel 5, (V5−V6=f); and the front end circuit 217 is configured to output a first differential signal g of voltages corresponding to the Sensor Channel 7 and the Sensor Channel 6 (V6−V7=g).

The second front end circuit 221 is configured to output a second differential signal h of voltages corresponding to the Sensor Channel 7 and the reference capacitor (V7−Vref=h), and the second front end circuit 222 is configured to output a second differential signal i of voltages corresponding to the Sensor Channel 0 and the reference capacitor (V0−Vref=i).

The processing circuit 230 is configured to find, according to the first differential signals (a, b, c, d, e, f, g) and the second differential signals (h, i) acquired in the foregoing process, V0, V1, V2, V3, V4, V5, V6 and V7.

V0, V1, V2, V3, V4, V5, V6 and V7 correspond to C0, C1, C2, C3, C4, C5, C6 and C7. C0, C1, C2, C3, C4, C5, C6 and C7 can be obtained according to V0, V1, V2, V3, V4, V5, V6 and V7.

Specifically, V0, V1, V2, V3, V4, V5, V6 and V7 can be found according to the following equations:

$$V0-V1=a;$$

$$V1-V2=b;$$

$$V2-V3=c;$$

$$V3-V4=d;$$

$$V4-V5=e;$$

$$V5-V6=f;$$

$$V6-V7=g;$$

$$V7-Vref=h; \text{ and}$$

$$V0-Vref=i,$$

where a, b, c, d, e, f, g can be acquired from the first differential signals output by the first front end circuits, h and i can be acquired from the second differential signals output by the second front end circuits, and further, the processing circuit 230 can obtain V0=i+Vref, V1=V0−a, V2=V1−b, V3=V2−c, V4=V3−d, V5=V4−e, V6=V5−f, and V7=V6−g. V7=h+Cref can be used to check whether a working state of the circuit is correct again. V0, V1, V2, V3, V4, V5, V6 and V7 correspond to C0, C1, C2, C3, C4, C5, C6, C7; and C0, C1, C2, C3, C4, C5, C6 and C7 can be obtained according to V0, V1, V2, V3, V4, V5, V6 and V7.

Optionally, as shown in FIG. 2, the at least N−2 first front end circuits include first front end circuits 212-217. A first input end and a second input end of each of the first front end circuits 212-217 are respectively connected to two different capacitors to be detected. For example, the first front end circuit 212 is connected to the Sensor Channel 1 and the Sensor Channel 2, respectively; and the first front end circuit 213 is connected to the Sensor Channel 2 and the Sensor Channel 3, respectively.

Optionally, as shown in FIG. 2, a first front end circuit except the at least N−2 first front end circuits is the first front end circuit 211. A first input end of the first front end circuit 211 is simultaneously connected to a third input end of the second front end circuit 222 and the Sensor Channel 0, and a second input end of the first front end circuit 211 is simultaneously connected to a first input end of the first front end circuit 212 and the Sensor Channel 1.

Optionally, a third input end and a fourth input end of each of the at least one second front end circuit are respectively connected to two different capacitors to be detected. For example, as shown in FIG. 2, the third input end of the second front end circuit 221 is connected to the Sensor Channel 7, and the fourth input end of the second front end circuit 221 is connected to the reference capacitor.

Optionally, each of the N first front end circuits 210 includes a first input end 241, a second input end 242, and a first output end 243; and the first input end 241 of each of the first front end circuits is connected to one of the two connected capacitors to be detected, the second input end 242 is connected to the other of the two connected capacitors to be detected; the first output end 243 is connected to the processing circuit 230, and the first output end 243 is configured to output, to the processing circuit 230, a first differential signal of voltages corresponding to the capacitor to be detected to which the first input end 241 is connected and the capacitor to be detected to which the second input end 242 is connected.

For example, as shown in FIG. 2, the first input end 241 of the first front end circuit 211 is connected to the Sensor Channel 0, the first input end 241 of the first front end circuit 212 is connected to the Sensor Channel 1, the first input end 241 of the first front end circuit 213 is connected to the Sensor Channel 2, the first input end 241 of the first front end circuit 214 is connected to the Sensor Channel 3, the first input end 241 of the first front end circuit 215 is connected to the Sensor Channel 4, the first input end 241 of the first front end circuit 216 is connected to the Sensor Channel 5, and the first input end 241 of the first front end circuit 217 is connected to the Sensor Channel 6; and the second input end 242 of the first front end circuit 211 is connected to the Sensor Channel 1, the second input end 242 of the first front end circuit 212 is connected to the Sensor Channel. 2, the second input end 242 of the first front end circuit 213 is connected to the Sensor Channel 3, the second input end 242 of the first front end circuit 214 is connected to the Sensor Channel 4, and the second input end 242 of the first front end circuit 215 is connected to the Sensor Channel 5, the second input end 242 of the first front end circuit 216 is connected to the Sensor Channel 6, and the second input end 242 of the first front end circuit 217 is connected to the Sensor Channel 7.

It should be understood that, the number of capacitors to be detected to which the first input end or the second input end of the first front-end circuit can be connected in FIG. 2 is merely an example, the number thereof is not limited to one, and a differential operation may also be performed on a plurality of capacitors to be detected, which is not limited in the embodiment of the present application.

Optionally, each of the at least one second front end circuit 220 includes a third input end 251, a fourth input end 252, and a second output end 253; the third input end 251 of each of the second front end circuits is connected to a capacitor to be detected, the fourth input end 252 is connected to a reference capacitor, and the second output end 253 is connected to the processing circuit 230; and the second output end 253 is configured to output, to the processing circuit 230, a second differential signal of voltages corresponding to the capacitor to be detected to which the third input end 251 is connected and the reference capacitor to which the fourth input end 252 is connected.

For example, as shown in FIG. 2, the third input end 251 of the second front end circuit 221 is connected to the Sensor Channel 7, and the fourth input end 252 of the second front end circuit 221 is connected to the reference capacitor; and the third input end 251 of the second front end circuit 222 is connected to the Sensor Channel 0, and the fourth input end 252 of the second front end circuit 222 is connected to the reference capacitor.

It should be understood that, the forgoing connection refers to being capable of transmitting a signal (such as, a capacitive signal, a voltage signal, a first differential signal, a second differential signal), and does not necessarily refer to a connection in a physical sense, and the connection described hereinafter is the same.

It should be understood that, the number of capacitors to be detected to which the third input end of the second front end circuit can be connected, and the number of reference capacitors to which the fourth input end of the second front end circuit can be connected in FIG. 2 are merely an example, the number thereof is not limited to one, and differencing operation may also be performed on a plurality of capacitors to be detected and reference capacitors, which is not limited in the embodiment of the present application.

Optionally, as an embodiment, the first front end circuit includes a first control circuit and a first programmable gain amplifier (PGA) circuit, where the first control circuit is connected to a DC voltage source, two capacitors to be detected to which the first front end circuit is connected, and the first PGA circuit;

the first control circuit is configured to control the DC voltage source to charge the two capacitors to be detected to which the first front end circuit is connected, and control discharge of the two capacitors to be detected to which the first front end circuit is connected; and the first PGA circuit is configured to convert, when the two capacitors to be detected to which the first front end circuit is connected discharge, capacitance signals of the capacitors to be detected into first voltage signals, and perform differencing on the first voltage signals of the two connected capacitors to be detected, to obtain a first differential signal of voltages corresponding to the two capacitors to be detected to which the first front end circuit is connected.

Optionally, the DC voltage source may be a 1.2V DC voltage source, a 2.4V DC voltage source, or a 5.0V DC voltage source.

Optionally, each of the first front end circuits may be connected to a DC voltage source, or all of the first front end circuits may be connected to a DC voltage source.

Optionally, the first control circuit includes a first switch group SW1 and a second switch group SW2.

Optionally, the first switch group is connected to the DC voltage source and the two capacitors to be detected to which the first front end circuit is connected, and the second switch group is connected to the two capacitors to be detected to which the first front end circuit is connected and the first PGA circuit.

Optionally, when the first switch group is in a closed state and the second switch group is in an open state, the DC voltage source charges the two capacitors to be detected to which the first front end circuit is connected; and when the second switch group is in a closed state and the first switch group is in an open state, the two capacitors to be detected to which the first front end circuit is connected discharge to the first PGA circuit.

Figure 3:
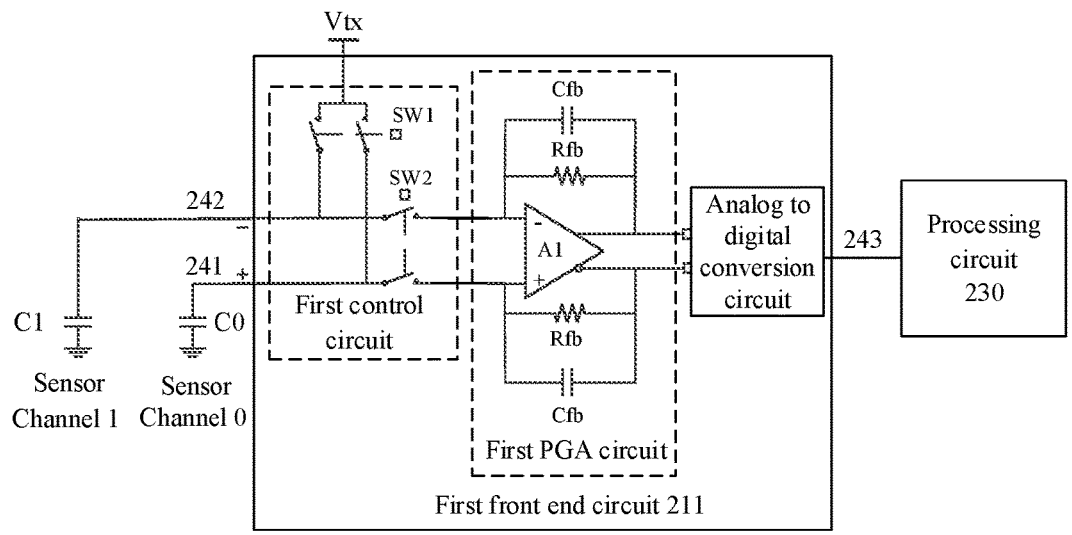
FIG. 3 is a schematic circuit diagram of a first front end circuit according to an embodiment of the present application.

For example, as shown in FIG. 3, a first input end 241 of a first front end circuit 211 is connected to a Sensor Channel 0, and a second input end 242 of the first front end circuit 211 is connected to a Sensor Channel 1; and a first control circuit is connected to a DC voltage source Vtx, the Sensor Channel 0, the Sensor Channel 1 and a first PGA circuit.

Firstly, a SW1 in the first control circuit is turned on, a SW2 is turned off, and the DC voltage source is controlled to charge the Sensor Channel 0 and the Sensor Channel 1; and after charging the Sensor Channel 0 and the Sensor Channel 1 (for example, charged to 20%, or more preferably, fully charged), the SW1 in the first control circuit is turned off, the SW2 is turned on, and discharge of the Sensor Channel 0 and the Sensor Channel 1 is controlled (for example, fully discharged); when the Sensor Channel 0 and the Sensor Channel 1 discharge, the first PGA circuit converts capacitance signals of the Sensor Channel 0 and the Sensor Channel 1 into first voltage signals (for example, a capacitance signal C0 of the Sensor Channel 0 is converted into a first voltage signal V0, and a capacitance signal C1 of the Sensor Channel 1 is converted into a first voltage signal V1), performs differencing on the first voltage signals of the Sensor Channel 0 and the Sensor Channel 1, to obtain a first differential signal (V0−V1) of voltages corresponding to the Sensor Channel 0 and the Sensor Channel 1 to which the first front end circuit 211 is connected.

Optionally, a difference value (V0−V1) of the first voltage signals obtained by conversion of the capacitance signals of the Sensor Channel 0 and the Sensor Channel 1 is proportional to a difference value (C0−C1) of the capacitance signals of the Sensor Channel 0 and the Sensor Channel 1.

It should be understood that, FIG. 3 merely takes the first front end circuit 211 as an example for illustration and description, and other first front end circuits adapted to the embodiment of the present application also satisfy the example described in FIG. 3.

Optionally, under the control of the first switch group and the second switch group, after the two capacitors to be detected to which the first front end circuit is connected are subjected to at least one charge and at least one discharge, the first front end circuit outputs the first differential signal of the voltages corresponding to the two connected capacitors to be detected.

For example, it may be fully charged each time and fully discharged each time.

For another example, it may be charged to 80% then discharged to 50%, and continue to be charged to 80% then discharged to 50%.

It should be understood that, the number of times of charging and discharging, and the amount of specific charging and discharging are not limited in the embodiment of the present application.

Optionally, as an embodiment, the first front end circuit includes a first conversion circuit and a second PGA circuit, where the first conversion circuit is connected to a driving voltage source, two capacitors to be detected to which the first front end circuit is connected, and the second PGA circuit;

the first conversion circuit is configured to convert capacitance signals of the two capacitors to be detected to which the first front end circuit is connected into first voltage signals; and the second PGA circuit is configured to acquire, from the first conversion circuit, the first voltage signals corresponding to the two capacitors to be detected to which the first front end circuit is connected, and perform differencing on the first voltage signals of the two connected capacitors to be detected, to obtain a first differential signal of voltages corresponding to the two capacitors to be detected to which the first front end circuit is connected.

Optionally, the first conversion circuit includes a first voltage division resistor and a second voltage division resistor, where the first voltage division resistor is connected to the driving voltage source, the second PGA circuit, and one of the two capacitors to be detected to which the first front end circuit is connected; and the second voltage division resistor is connected to the driving voltage source, the second PGA circuit, and the other of the two capacitors to be detected to which the first front end circuit is connected.

Figure 4:
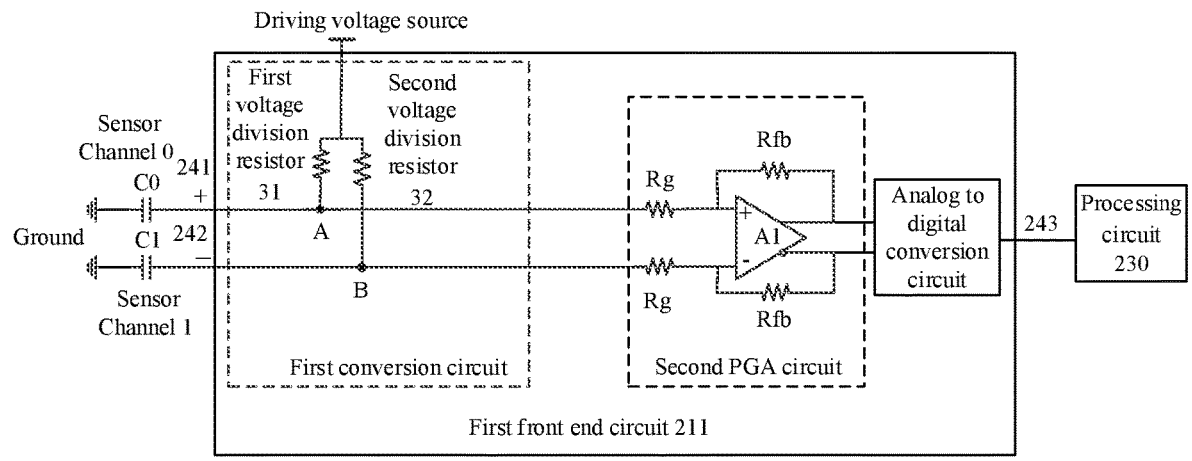
FIG. 4 is a schematic circuit diagram of another first front end circuit according to an embodiment of the present application.

For example, as shown in FIG. 4, a first front end circuit 211 is connected to a Sensor Channel 0 and a Sensor Channel 1; a first voltage division resistor 31 of a first conversion circuit is connected to a driving voltage source, the Sensor Channel 0 and a second PGA circuit; a second voltage division resistor 32 of the first conversion circuit is connected to the driving voltage source, the Sensor Channel 1 and the second PGA circuit, and the Sensor Channel 0 and the Sensor Channel 1 are connected to the second PGA circuit (a positive input end and a negative input end) respectively.

As shown in FIG. 4, in the first conversion circuit, the driving voltage source, the first voltage division resistor 31 and the Sensor Channel 0 constitute a complete circuit. In this circuit, the Sensor Channel 0 serves as an impedance, and the second PGA circuit may obtain a first voltage signal of the Sensor Channel 0 by measuring a voltage at point A;

the driving voltage source, the second voltage division resistor 32 and the Sensor Channel 1 constitute a complete circuit. In this circuit, the Sensor Channel 1 serves as an impedance, and the second PGA circuit may obtain a first voltage signal of the Sensor Channel 1 by measuring a voltage at point B; and further, the second PGA circuit may perform differencing on the first voltage signals of the Sensor Channel 0 and the Sensor Channel 1, to obtain a first differential signal (V0−V1) of voltages corresponding to the Sensor Channel 0 and the Sensor Channel 1 to which the first front end circuit 211 is connected.

It should be understood that, FIG. 4 merely takes the first front end circuit 211 as an example for illustration and description, and other first front end circuits adapted to the embodiment of the present application also satisfy the example described in FIG. 4.

Optionally, the second PGA circuit may also achieve filtering by connecting a capacitor Cfb to a resistor Rfb in parallel.

Optionally, the first conversion circuit may further include a first buffer and a second buffer, the driving voltage source is connected to a capacitor to be detected through the first voltage division resistor and the first buffer, and the driving voltage source is connected to the other capacitor to be detected through the second voltage division resistor and the second buffer.

A capacitor to be detected is connected to the second PGA circuit (a positive input end) through the first buffer, and the other capacitor to be detected is connected to the second PGA circuit (a negative input end) through the second buffer.

Optionally, as an embodiment, the second front end circuit includes a second control circuit and a third PGA circuit, where the second control circuit is connected to a DC voltage source, the third PGA circuit, a capacitor to be detected and a reference capacitor to which the second front end circuit is connected;

the second control circuit is configured to control the DC voltage source to charge the capacitor to be detected and the reference capacitor to which the second front end circuit is connected, and control discharge of the capacitor to be detected and the reference capacitor to which the second front end circuit is connected; and the third PGA circuit is configured to convert, when the capacitor to be detected and the reference capacitor to which the second front end circuit is connected discharge, a capacitance signal of the capacitor to be detected and a capacitance signal the reference capacitor into second voltage signals, and perform differencing on the second voltage signal of the connected capacitor to be detected and the second voltage signal of the connected reference capacitor, to obtain a second differential signal of voltages corresponding to the capacitor to be detected and the reference capacitor to which the second front end circuit is connected.

Optionally, the second control circuit includes a third switch group SW3 and a fourth switch group SW4.

Optionally, the third switch group is connected to the DC voltage source and the capacitor to be detected and the reference capacitor to which the second front end circuit is connected, and the fourth switch group is connected to the third PGA circuit and the capacitor to be detected and the reference capacitor to which the second front end circuit is connected.

Optionally, when the third switch group is in a closed state and the fourth switch group is in an open state, the DC voltage source charges the capacitor to be detected and the reference capacitor to which the second front end circuit is connected; and when the fourth switch group is in a closed state and the third switch group is in an open state, the capacitor to be detected and the reference capacitor to which the second front end circuit is connected discharge to the third PGA circuit.

Figure 5:
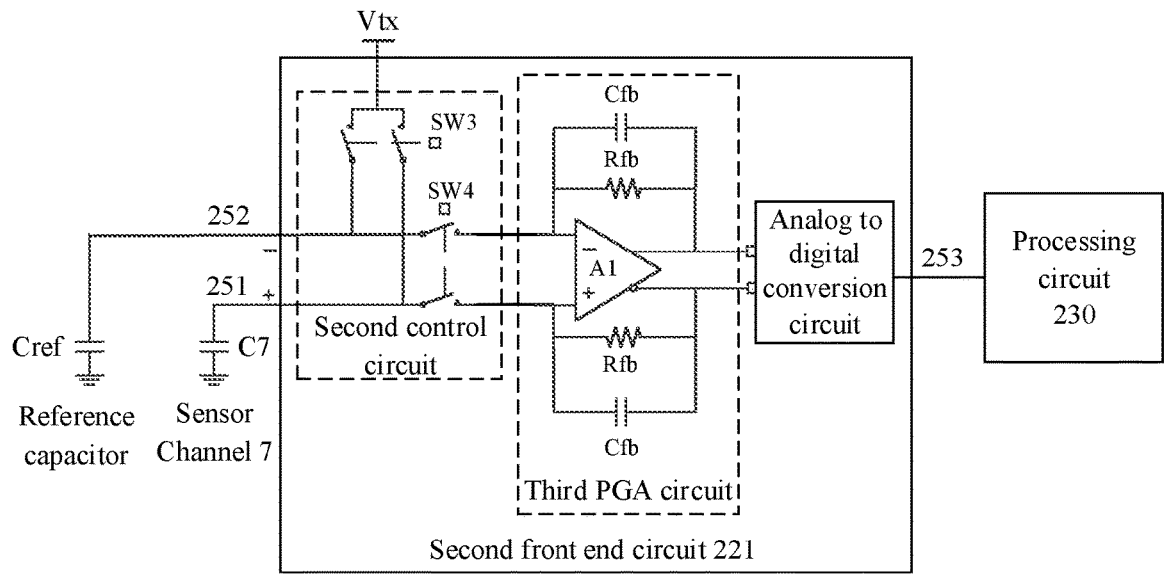
FIG. 5 is a schematic circuit diagram of a second front end circuit according to an embodiment of the present application.

For example, as shown in FIG. 5, a third input end 251 of a second front end circuit 221 is connected to a Sensor Channel 7, and a fourth input end 252 of the second front end circuit 221 is connected to a reference capacitor; and a second control circuit is connected to a DC voltage source Vtx, the Sensor Channel 7, the reference capacitor and a third PGA circuit.

Firstly, a SW3 in the second control circuit is turned on, a SW4 is turned off, the DC voltage source is controlled to charge the Sensor Channel 7 and the reference capacitor; and after charging the Sensor Channel 7 and the reference capacitor (for example, charged to 50%, or more preferably, fully charged), the SW3 in the second control circuit is turned off, the SW4 is turned on, and discharge of the Sensor Channel 7 and the reference capacitor is controlled (for example, fully discharged); when the Sensor Channel 7 and the reference capacitor discharge, the third PGA circuit converts capacitance signals of the Sensor Channel 7 and the reference capacitor into second voltage signals (for example, a capacitance signal C7 of the Sensor Channel 7 is converted into a second voltage signal V7, and a capacitance signal Cref of the reference capacitor is converted into a second voltage signal Vref), and performs differencing on the second voltage signals of the Sensor Channel 7 and the reference capacitor, to obtain a second differential signal (V7−Vref) of voltages corresponding to the Sensor Channel 7 and the reference capacitor to which the second front end circuit 221 is connected.

It should be understood that, FIG. 5 merely takes the second front end circuit 221 as an example for illustration and description, and other second front end circuits (for example, a second front end circuit 222) applicable to the embodiment of the present application also satisfy the example described in FIG. 5.

Optionally, under the control of the third switch group and the fourth switch group, after the capacitor to be detected and the reference capacitor to which the second front end circuit is connected are subjected to at least one charge and at least one discharge, the second front end circuit outputs the second differential signal of the voltages corresponding to the connected capacitor to be detected and the connected reference capacitor.

For example, it may be fully charged each time and discharged each time.

For another example, it may be charged to 80% then discharged to 50%, and continue to be charged to 80% then discharged to 50%.

It should be understood that, the number of times of charging and discharging, and the amount of specific charging and discharging are not limited in the embodiment of the present application.

Optionally, as an embodiment, the second front end circuit includes a second conversion circuit and a fourth PGA circuit, where
the second conversion circuit is connected to a driving voltage source, the fourth PGA circuit, and a capacitor to be detected and a reference capacitor to which the second front end circuit is connected;
the second conversion circuit is configured to convert capacitance signals of the capacitor to be detected and the reference capacitor to which the second front end circuit is connected into second voltage signals; and
the fourth PGA circuit is configured to acquire, from the second conversion circuit, second voltage signals corresponding to the capacitor to be detected and the reference capacitor to which the second front end circuit is connected, and perform differencing on the second voltage signal of the connected capacitor to be detected and the second voltage signal of the connected reference capacitor, to obtain a second differential signal of voltages corresponding to the capacitor to be detected and the reference capacitor to which the second front end circuit is connected.

Optionally, the second conversion circuit includes a third voltage division resistor and a fourth voltage division resistor, where
the third voltage division resistor is connected to the driving voltage source, the fourth PGA circuit, and the capacitor to be detected to which the second front end circuit is connected; and
the fourth voltage division resistor is connected to the driving voltage source, the fourth PGA circuit, and the reference capacitor to which the second front end circuit is connected.

Figure 6:
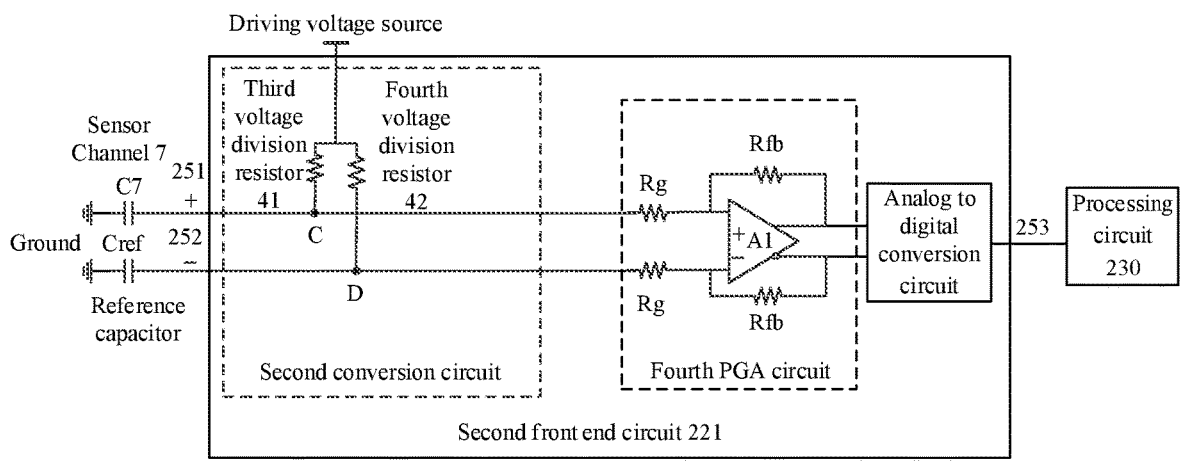
FIG. 6 is a schematic circuit diagram of another second front end circuit according to an embodiment of the present application.

For example, as shown in FIG. 6, a second front end circuit 221 is connected to a Sensor Channel 7 and a reference capacitor; a third voltage division resistor 41 of a second conversion circuit is connected to a driving voltage source, the Sensor Channel 7 and a fourth PGA circuit, and a fourth voltage division resistor 42 of the second conversion circuit is connected to the driving voltage source, the reference capacitor and the fourth PGA circuit; and the Sensor Channel 7 and the reference capacitor are connected to the fourth PGA circuit (a positive input end and a negative input end) respectively.

As shown in FIG. 6, in the second conversion circuit, the driving voltage source, the third voltage division resistor 41 and the Sensor Channel 7 constitute a complete circuit. In this circuit, the Sensor Channel 7 serves as an impedance, and the fourth PGA circuit may obtain a second voltage signal of the Sensor Channel 7 by measuring a voltage at point C;
the driving voltage source, the fourth voltage division resistor 42, and the reference capacitor constitute a complete circuit. In this circuit, the reference capacitor serves as an impedance, and the fourth PGA circuit may obtain a second voltage signal of the reference capacitor by measuring a voltage at point D; and
further, the fourth PGA circuit may perform differencing on the second voltage signal of the Sensor Channel 7 and the second voltage signal of the reference capacitor, to obtain a second differential signal (V7−Vref) of voltages corresponding to the Sensor Channel 7 and the reference capacitor to which the second front end circuit 221 is connected.

It should be understood that, FIG. 6 merely takes the second front end circuit 221 as an example for illustration and description, and other second front end circuits (for example, a second front end circuit 222) adapted to the embodiment of the present application also satisfy the example described in FIG. 6.

Optionally, the fourth PGA circuit may also achieve filtering by connecting a capacitor Cfb to a resistor Rfb in parallel.

Optionally, the second conversion circuit may further include a first buffer and a second buffer, the driving voltage source is connected to a capacitor to be detected through the third voltage division resistor and the third buffer; and the driving voltage source is connected to the reference capacitor through the fourth voltage division resistor and the fourth buffer; and
the capacitor to be detected is connected to the fourth PGA circuit (a positive input end) through the third buffer, and the reference capacitor is connected to the fourth PGA circuit (a negative input end) through the fourth buffer.

Optionally, as an embodiment, the first front end circuit includes a first filter circuit and/or a first integration circuit, where
the first filter circuit is configured to filter an interference signal in a first differential signal of voltages corresponding to two connected capacitors to be detected output by the first front end circuit; and
the first integration circuit is configured to perform integration and amplification processing on the first differential signal of the voltages corresponding to the two connected capacitors to be detected output by the first front end circuit.

Figure 7:
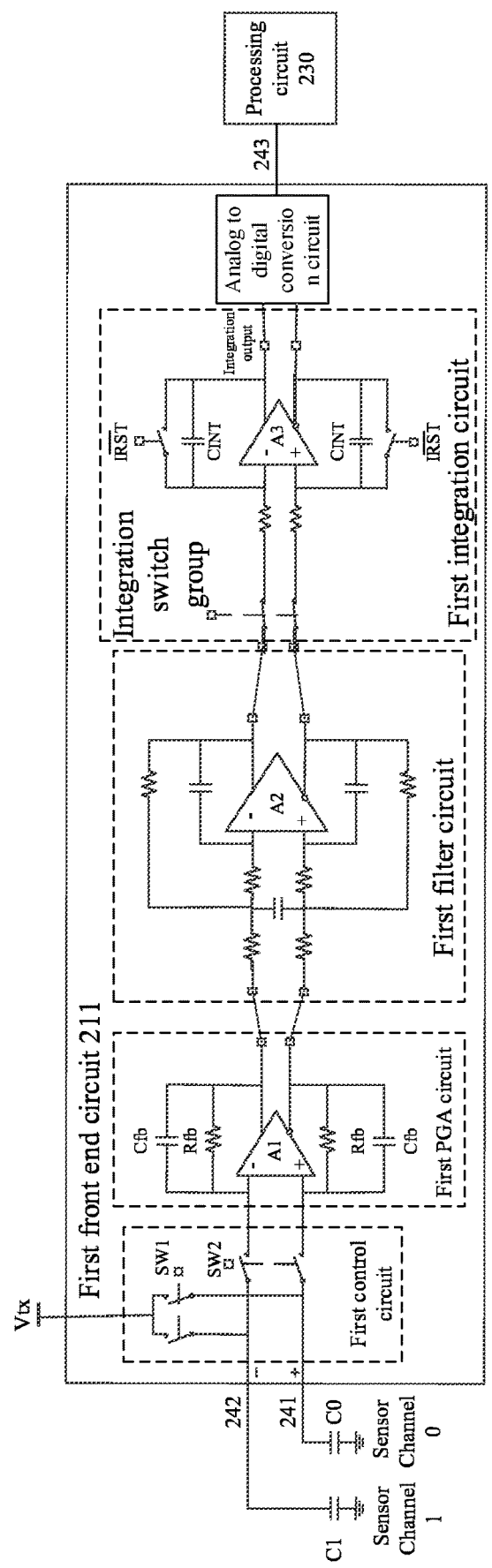
FIG. 7 is a schematic circuit diagram using still another first front end circuit according to an embodiment of the present application.

Optionally, the first front end circuit may achieve the purpose of converting capacitance signals into first voltage signals and performing differencing on the first voltage signals by using a circuit as shown in FIG. 3, and in this case, a first filter circuit and/or a first integration circuit may be as shown in FIG. 7.

Optionally, the first filter circuit and the first integration circuit may be separately disposed in the first front end circuit, or may be disposed in the first front end circuit in combination. FIG. 7 merely exemplarily describes a solution that the first filter circuit and the first integration circuit are disposed in the first front end circuit in combination.

Figure 8:
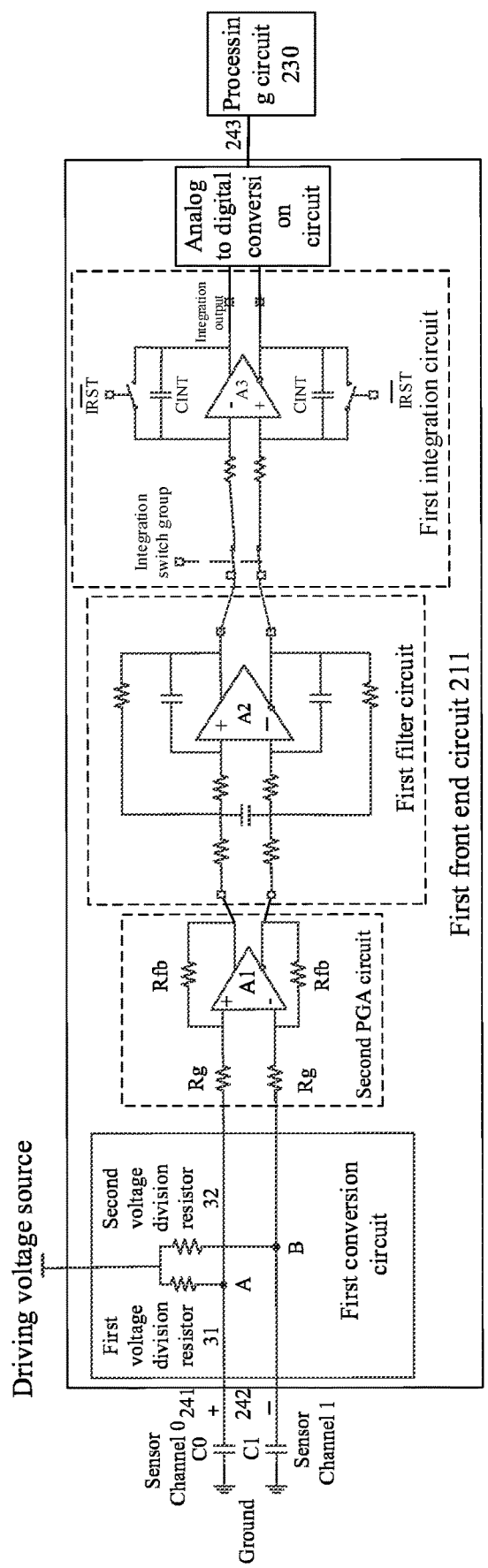
FIG. 8 is a schematic circuit diagram of yet another first front end circuit according to an embodiment of the present application.

Optionally, the first front end circuit may achieve the purpose of converting capacitance signals into first voltage signals and performing differencing on the first voltage signals by using a circuit as shown in FIG. 4, and in this case, a first filter circuit and/or a first integration circuit may be as shown in FIG. 8.

Optionally, the first filter circuit and the first integration circuit may be separately disposed in the first front end circuit, or may be disposed in the first front end circuit in combination. FIG. 8 merely exemplarily describes a solution that the first filter circuit and the first integration circuit are disposed in the first front end circuit in combination.

Optionally, the first filter circuit may be a low pass filter.

Optionally, the first filter circuit may be an active analog low pass filter composed of an amplifier, but is not limited thereto.

Optionally, the first integration circuit may amplify a weak capacitance difference signal, to increase a signal noise ratio (SNR).

It should be understood that, the first integration circuit shown in FIG. 7 and FIG. 8 may also integrate and amplify other first differential signals output by the first front end circuit that can achieve the purpose of converting the capacitance signals into the first voltage signals and performing differencing on the first voltage signals.

It should be understood that, the first filter circuit shown in FIG. 7 and FIG. 8 may also filter other interference signals in the first differential signal output by the first front end circuit that can achieve the purpose of converting the capacitance signals into the first voltage signals and performing differencing on the first voltage signals.

Optionally, as an embodiment, the second front end circuit includes a second filter circuit and/or a second integration circuit, where the second filter circuit is configured to filter an interference signal in a second differential signal of voltages corresponding to a connected capacitor to be detected and a connected reference capacitor output by the second front end circuit; and the second integration circuit is configured to perform integration and amplification processing on the second differential signal of the voltages corresponding to the connected capacitor to be detected and the connected reference capacitor output by the second front end circuit.

Figure 9:
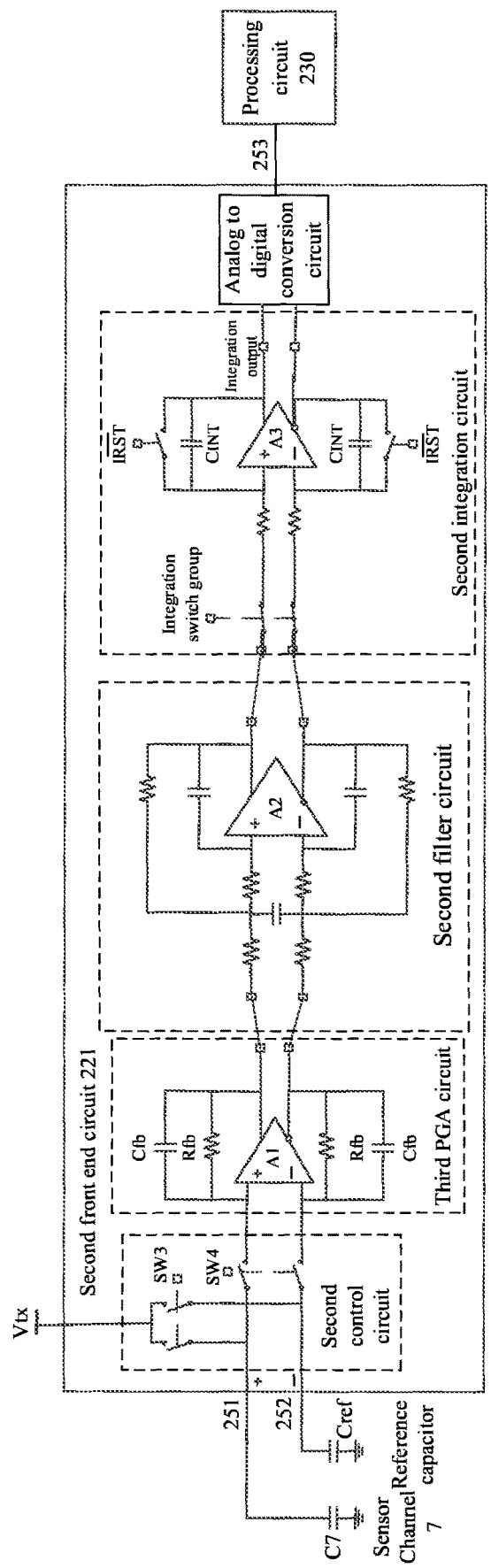
FIG. 9 is a schematic circuit diagram of still another second front end circuit according to an embodiment of the present application.

Optionally, the second front end circuit may achieve the purpose of converting capacitance signals into second voltage signals and performing differencing on the second voltage signals by using a circuit as shown in FIG. 5, and in this case, a second filter circuit and/or a second integration circuit may be as shown in FIG. 9.

Optionally, the second filter circuit and the second integration circuit may be separately disposed in the second front end circuit, or may be disposed in the second front end circuit in combination. FIG. 9 merely exemplarily describes a solution that the second filter circuit and the second integration circuit are disposed in the second front end circuit in combination.

Figure 10:
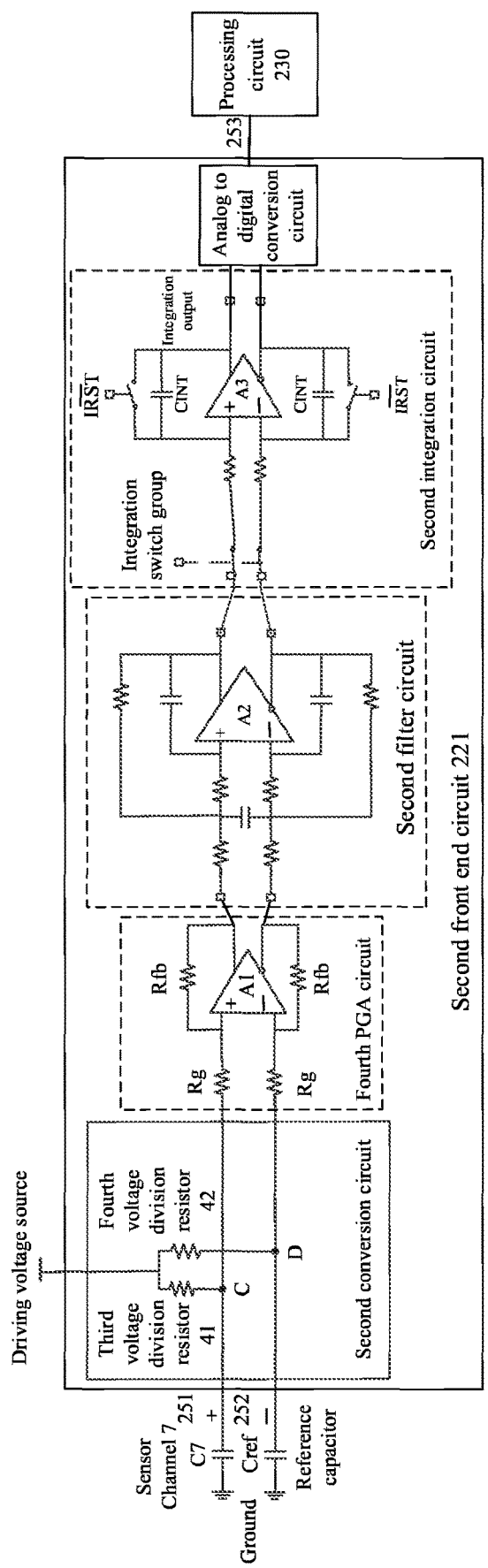
FIG. 10 is a schematic circuit diagram of yet another second front end circuit according to an embodiment of the present application.

Optionally, the second front end circuit may achieve the purpose of converting capacitance signals into second voltage signals and performing differencing on the second voltage signals by using a circuit as shown in FIG. 6, and in this case, a second filter circuit and/or a second integration circuit may be as shown in FIG. 10.

Optionally, the second filter circuit and the second integration circuit may be separately disposed in the second front end circuit, or may be disposed in the second front end circuit in combination. FIG. 10 merely exemplarily describes a solution that the second filter circuit and the second integration circuit are disposed in the second front end circuit in combination.

Optionally, the second filter circuit may be a low pass filter.

Optionally, the second filter circuit may be an active analog low pass filter composed of an amplifier, but is not limited thereto.

Optionally, the second integration circuit may amplify a weak capacitance difference signal, to increase a signal noise ratio (SNR).

It should be understood that, the second integration circuit shown in FIG. 9 and FIG. 10 may also integrate and amplify other second differential signals output by the second front end circuit that can achieve the purpose of converting the capacitance signals into the second voltage signals and performing differencing on the second voltage signals.

It should be understood that, the second filter circuit shown in FIG. 9 and FIG. 10 may also filter other interference signals in the second differential signal output by the second front end circuit that can achieve the purpose of converting the capacitance signals into the second voltage signals and performing differencing on the second voltage signals.

Optionally, all of the first front end circuits may include merely one integration circuit, to achieve integration and amplification of output signals of the first front end circuit.

Optionally, all of the second front end circuits may include merely one integration circuit, to achieve integration and amplification of output signals of the second front end circuit.

Optionally, all of the first front end circuits may include merely one filter circuit, to achieve filtering of output signals of the first front end circuit.

Optionally, all of the second front end circuits may include merely one filter circuit, to achieve filtering of output signals of the second front end circuit.

Optionally, each of the first front end circuits includes an ADC circuit for analog to digital conversion of an output signal of the first front end circuit.

Optionally, each of the second front end circuits includes an ADC circuit for analog to digital conversion of an output signal of the second front end circuit.

Optionally, all of the first front end circuits and all of the second front end circuits include the same ADC circuit for analog-to-digital conversion of signals output by the first front end circuit and the second front end circuit.

Therefore, in a capacitance detection circuit of an embodiment of the present application, a first front end circuit outputs, to a processing circuit, a first differential signal of voltages corresponding to two connected capacitors to be detected, and a second front end circuit outputs, to the processing circuit, a second differential signal of voltages corresponding to a connected capacitor to be detected and a connected reference capacitor, which is a differencing process; the processing circuit determines, according to the first differential signal received from the first front end circuit and the second differential signal received from the second front end circuit, a capacitance value of each of N capacitors to be detected, which is a recovery process. Sensitivity of capacitance detection could be improved by means of differencing followed by recovery without substantively increasing costs.

Further, the first control circuit controls the DC voltage source to charge the two capacitors to be detected to which the first front end circuit is connected, and controls discharge of the two capacitors to be detected to which the first front end circuit is connected, and thus the first PGA circuit may convert capacitance signals of the two capacitors to be detected to which the first front end circuit is connected into first voltage signals, and perform differencing on the first voltage signals, which achieves a purpose of converting the capacitance signals into the first voltage signals and performing differencing, and further, the first front end circuit may output a first differential signal of voltages corresponding to the two connected capacitors to be detected.

The second control circuit controls the DC voltage source to charge the capacitor to be detected and the reference capacitor to which the second front end circuit is connected, and control discharge of the capacitor to be detected and the reference capacitor to which the second front end circuit is connected, and thus the third PGA circuit may convert capacitance signals of the capacitor to be detected and the reference capacitor to which the second front end circuit is connected into second voltage signals, and perform differencing on the second voltage signals, which achieves a purpose of converting the capacitance signals into the second voltage signals and performing differencing, and further, the second front end circuit may output a second differential signal of voltages corresponding to the connected capacitor to be detected and the connected reference capacitor.

Further, the first conversion circuit converts capacitance signals of the two capacitors to be detected to which the first front end circuit is connected into first voltage signal, and thus, the second PGA circuit may perform differencing on the first voltage signals of the two capacitors to be detected to which the first front end circuit is connected, which achieves a purpose of converting the capacitance signals into the first voltage signals and performing differencing, and further, the first front end circuit may output the first differential signal of the voltages corresponding to the two connected capacitors to be detected.

The second conversion circuit converts capacitance signal of the capacitor to be detected and the reference capacitor to which the second front end circuit is connected into second voltage signals, and thus the fourth PGA circuit may perform differencing on the second voltage signals of the capacitor to be detected and the reference capacitor to which the second front end circuit is connected, which achieves a purpose of converting the capacitance signals into the second voltage signals and performing differencing, and further, the second front end circuit may output the second differential signal of the voltages corresponding to the connected capacitor to be detected and the connected reference capacitor.

FIG. 11 is a schematic flowchart of a capacitance detection method 300 according to an embodiment of the present application. The method 300 includes the capacitance detection circuit 200 as shown in FIG. 2, and the method 300 includes:

310, each of at least N−1 first front end circuits converts capacitance signals of two connected capacitors to be detected into first voltage signals, and performs differencing on the first voltage signals of the two connected capacitors to be detected, to obtain a first differential signal of voltages corresponding to the two connected capacitors to be detected.

Optionally, the first front end circuit includes a first control circuit and a first programmable gain amplifier (PGA) circuit, and the first control circuit is connected to a DC voltage source, two capacitors to be detected to which the first front end circuit is connected, and the first PGA circuit;

that each of the at least N−1 first front end circuits converts the capacitance signals of the two connected capacitors to be detected into the first voltage signals, and performs differencing on the first voltage signals of the two connected capacitors to be detected, to obtain the first differential signal of the voltages corresponding to the two connected capacitors to be detected includes:

the first control circuit controls the DC voltage source to charge the two capacitors to be detected to which the first front end circuit is connected, and after charging the two capacitors to be detected to which the first front end circuit is connected, controls discharge of the two capacitors to be detected to which the first front end circuit is connected; and the first PGA circuit converts, when the two capacitors to be detected to which the first front end circuit is connected discharge, capacitance signals of the capacitors to be detected into first voltage signals, and performs differencing on the first voltage signals of the two connected capacitors to be detected, to obtain a first differential signal of voltages corresponding to the two capacitors to be detected to which the first front end circuit is connected.

Optionally, the first control circuit includes a first switch group and a second switch group;

that the first control circuit controls the DC voltage source to charge the two capacitors to be detected to which the first front end circuit is connected, and after charging the two capacitors to be detected to which the first front end circuit is connected, controls the discharge of the two capacitors to be detected to which the first front end circuit is connected includes:

when the first switch group is in a closed state and the second switch group is in an open state, the DC voltage source charges the two capacitors to be detected to which the first front end circuit is connected; and when the second switch group is in a closed state and the first switch group is in an open state, the two capacitors to be detected to which the first front end circuit is connected discharge to the first PGA circuit.

Optionally, the first front end circuit includes a first conversion circuit and a second PGA circuit, and the first conversion circuit is connected to a driving voltage source, two capacitors to be detected to which the first front end circuit is connected, and the second PGA circuit;

that each of the at least N−1 first front end circuits converts the capacitance signals of the two connected capacitors to be detected into the first voltage signals, and performs differencing on the first voltage signals of the two connected capacitors to be detected, to obtain the first differential signal of the voltages corresponding to the two connected capacitors to be detected includes:

the first conversion circuit converts capacitance signals of two capacitors to be detected to which the first front end circuit is connected into first voltage signals; and the second PGA circuit acquires, from the first conversion circuit, the first voltage signals corresponding to the two capacitors to be detected to which the first front end circuit is connected, and performs differencing on the first voltage signals of the two connected capacitors to be detected, to obtain a first differential signal of voltages corresponding to the two capacitors to be detected to which the first front end circuit is connected.

320, each of at least one second front end circuit converts capacitance signals of a connected capacitor to be detected and a connected reference capacitor into second voltage signals, and performs differencing on the second voltage signal of the connected capacitor to be detected and the second voltage signal of the connected reference capacitor, to obtain a second differential signal of voltages corresponding to the connected capacitor to be detected and the connected reference capacitor.

Optionally, the second front end circuit includes a second control circuit and a third PGA circuit, and the second control circuit is connected to a DC voltage source, the third PGA circuit, and a capacitor to be detected and a reference capacitor to which the second front end circuit is connected;

that each of the at least one second front end circuit converts the capacitance signals of the connected capacitor to be detected and the connected reference capacitor into the second voltage signals, and performs differencing on the second voltage signal of the connected capacitor to be detected and the second voltage signal of the connected reference capacitor, to obtain the second differential signal of the voltages corresponding to the connected capacitor to be detected and the connected reference capacitor includes:

the second control circuit controls the DC voltage source to charge the capacitor to be detected and the reference capacitor to which the second front end circuit is connected, and after charging the capacitor to be detected and the reference capacitor to which the second front end circuit is connected, controls discharge of the capacitor to be detected and the reference capacitor to which the second front end circuit is connected; and the third PGA circuit converts, when the capacitor to be detected and the reference capacitor to which the second front end circuit is connected discharge, capacitance signals of the capacitor to be detected and the reference capacitor into second voltage signals, and performs differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

Optionally, the second control circuit includes a third switch group and a fourth switch group;

that the second control circuit controls the DC voltage source to charge the capacitor to be detected and the reference capacitor to which the second front end circuit is connected, and after charging the capacitor to be detected and the reference capacitor to which the second front end circuit is connected, controls the discharge of the capacitor to be detected and the reference capacitor to which the second front end circuit is connected includes:

when the third switch group is in a closed state and the fourth switch group is in an open state, the DC voltage source charges the capacitor to be detected and the reference capacitor to which the second front end circuit is connected; and when the fourth switch group is in a closed state and the third switch group is in an open state, the capacitor to be detected and the reference capacitor to which the second front end circuit is connected discharge to the third PGA circuit.

Optionally, the second front end circuit includes a second conversion circuit and a fourth PGA circuit, and the second conversion circuit is connected to a driving voltage source, the fourth PGA circuit, and a capacitor to be detected and a reference capacitor to which the second front end circuit is connected;

that each of the at least one second front end circuit converts the capacitance signals of the connected capacitor to be detected and the connected reference capacitor into the second voltage signals, and performs differencing on the second voltage signal of the connected capacitor to be detected and the second voltage signal of the connected reference capacitor, to obtain the second differential signal of the voltages corresponding to the connected capacitor to be detected and the connected reference capacitor includes:

the second conversion circuit converts capacitance signals of the capacitor to be detected and the reference capacitor to which the second front end circuit is connected into second voltage signals; and the fourth PGA circuit acquires, from the second conversion circuit, the second voltage signals corresponding to the capacitor to be detected and the reference capacitor to which the second front end circuit is connected, and performs differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

330, a processing circuit determines a capacitance value of each of N capacitors to be detected according to the first differential signal obtained by each of the first front end circuits and the second differential signal obtained by each of the second front end circuits.

Therefore, in a capacitance detection method of an embodiment of the present application, a first front end circuit outputs, to a processing circuit, a first differential signal of voltages corresponding to two connected capacitors to be detected, and a second front end circuit outputs, to the processing circuit, a second differential signal of voltages corresponding to a connected capacitor to be detected and a connected reference capacitor, which is a differencing process; the processing circuit determines, according to the first differential signal received from the first front end circuit and the second differential signal received from the second front end circuit, a capacitance value of each of N capacitors to be detected, which is a recovery process. Sensitivity of capacitance detection could be improved by means of differencing followed by recovery without substantively increasing costs.

Figure 12:
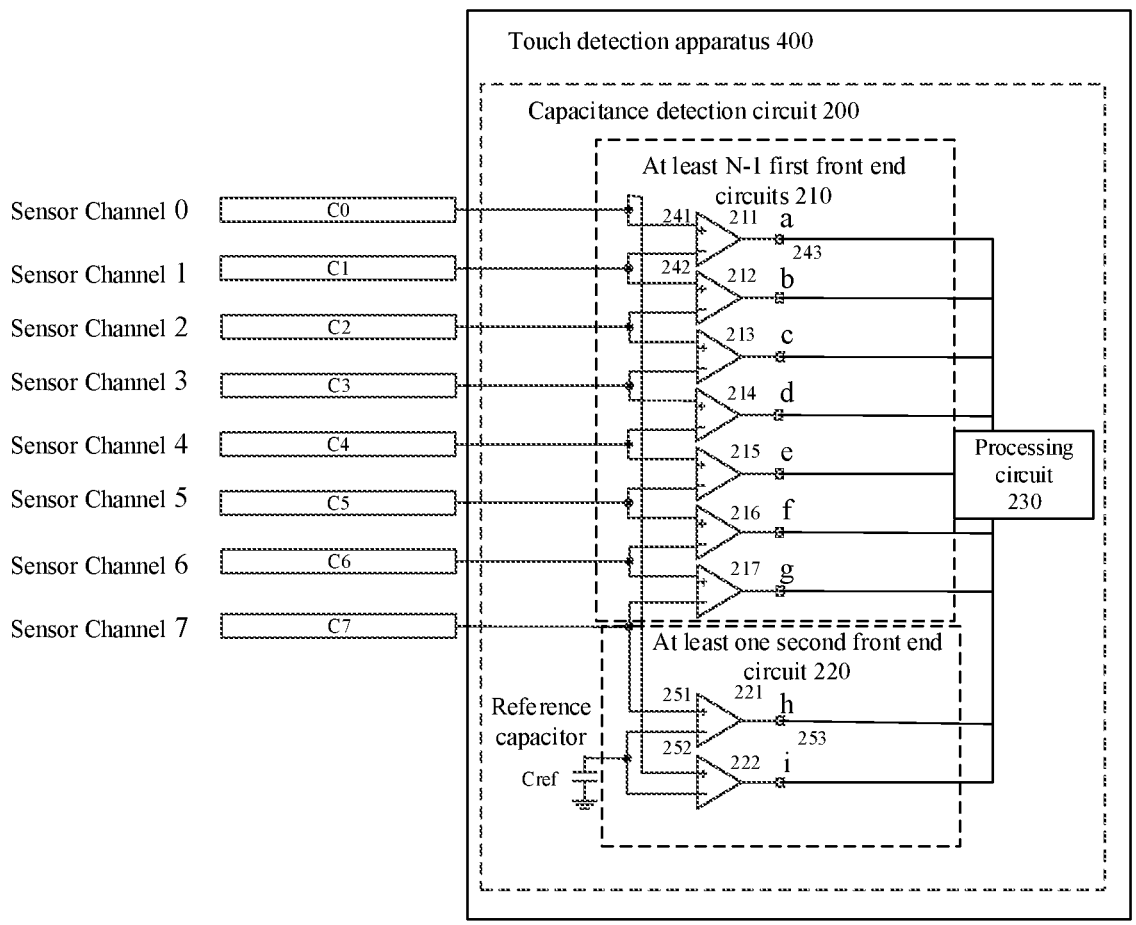
FIG. 12 is a schematic circuit diagram of a touch detection apparatus according to an embodiment of the present application.

FIG. 12 is a schematic circuit diagram of a touch detection apparatus 400 according to an embodiment of the present application.

As shown in FIG. 12, the touch detection apparatus 400 includes: the capacitance detection circuit 200 as shown in FIG. 2 to FIG. 10, where the touch detection apparatus 400 is configured to determine a touch position of a user according to capacitance values of N capacitors to be detected determined by the capacitance detection circuit. In some embodiments, the processing circuit in the capacitance detection circuit has a function of determining a touch position of a user according to capacitance values of the N capacitors to be detected determined by the capacitance detection circuit, or in the capacitance detection circuit, a processing apparatus having the function of determining the touch position of the user according to the capacitance values of the N capacitors to be detected determined by the capacitance detection circuit is implemented by other components/units. In some embodiments, the touch detection apparatus may be integrated into a chip, for example, integrated into a touch control chip, to detect a touch position of a user according to a touch control sensor.

Optionally, each of the N capacitors to be detected is a capacitor formed by an electrode of a touch channel and ground.

Therefore, according to a touch detection apparatus in an embodiment of the present application, the touch detection apparatus may determine a touch position of a user according to capacitance values of N capacitors to be detected processed by a capacitance detection circuit by means of differential and differencing followed by recovery. Thus, the touch position of the user can be accurately determined on the basis of an improvement in detection accuracy of a capacitance value of a capacitor to be detected.

Optionally, shapes of electrodes of N capacitors to be detected in an embodiment of the present application may be a triangle or a matrix type.

Figure 13:
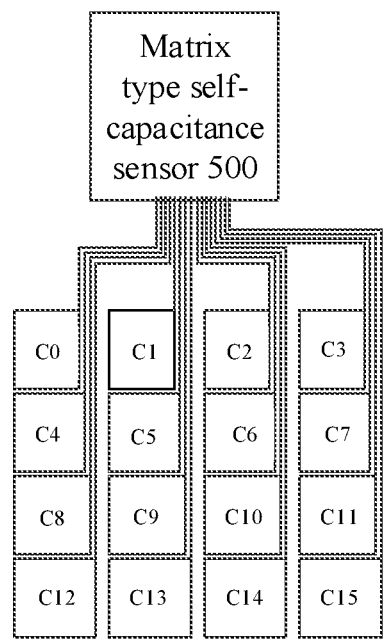
FIG. 13 shows a matrix type self-capacitance sensor applied to an embodiment of the present application.

For example, as shown in FIG. 13, a matrix type self-capacitance sensor 500 may determine a capacitance value of each of the matrix type self-capacitance sensors by the capacitance detection circuit 200 as shown in FIG. 2 to FIG. 10, and may determine a touch position of a user on the matrix type self-capacitance sensor 500 by the touch detection apparatus 400 as shown in FIG. 12.

It should be understood that, the matrix type self-capacitance sensor 500 is a capacitive touch control screen sensor that merely requires self-capacitance.

Figure 14:
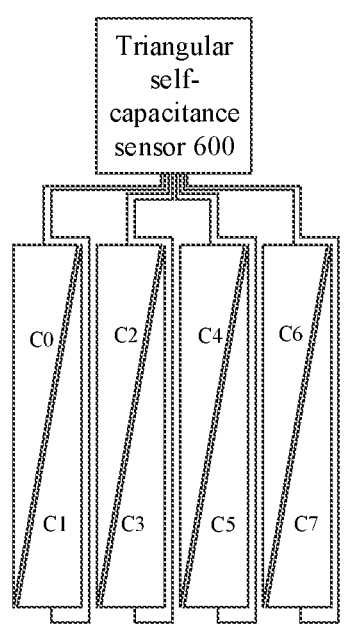
FIG. 14 shows a triangular self-capacitance sensor applied to an embodiment of the present application.

For another example, as shown in FIG. 14, a triangular self-capacitance sensor 600 may determine a capacitance value of each of the triangular self-capacitance sensors by the capacitance detection circuit 200 as shown in FIG. 2 to FIG. 10, and may determine a touch position of a user on the triangular self-capacitance sensor 600 by the touch detection apparatus 400 as shown in FIG. 12.

It should be understood that, the triangular self-capacitance sensor 600 is a capacitive touch control screen sensor that merely requires self-capacitance.

Optionally, an embodiment of the present application provides a terminal device, including the touch detection apparatus 400 as shown in FIG. 12.

Therefore, according to a terminal device in an embodiment of the present application, the terminal device includes a touch detection apparatus, and the touch detection apparatus may determine a touch position of a user according to capacitance values of N capacitors to be detected processed by a capacitance detection circuit by means of differencing followed by recovery. Thus, when the touch detection apparatus accurately determines the touch position of the user on the touch detection apparatus, the terminal device may accurately identify the touch position acquired by the touch detection apparatus, thereby improving touch control sensitivity, and optimizing an existing self-capacitance detection device.

Persons of ordinary skill in the art may be aware that various exemplary units and circuits described in conjunction with the embodiments disclosed herein can be implemented by electronic hardware or a combination of computer software and electronic hardware. Whether these functions are implemented in the form of hardware or software depends upon particular application of the technical solutions and constraint conditions of design. Persons skilled in the art may implement the described functions in different ways for each particular application, but such implementation should not be interpreted as causing a departure from the scope of the present application.

It should be understood that, in the several embodiments provided in the present application, the disclosed circuits, branches, and units may be implemented in other manners. For example, the above-described branches are merely exemplary. For example, dividing of the units is merely a type of logical function dividing, and there may be other dividing manners during actual implementation. For example, multiple units or components may be combined or integrated into a branch, or some features may be ignored, or may not be executed.

If being implemented in the form of a software functional unit and sold or used as a separate product, the integrated unit may be stored in a computer-readable storage medium. Based on such understanding, the nature of the technical solutions of the present application, or the part contributing to the prior art, or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The storage medium includes: various media that may store program codes, such as a U-disk, a removable hard disk, a read-only memory (ROM), a random access memory (RAM), a magnetic disk, a compact disk, and so on.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detection circuit for detecting capacitances of N capacitors to be detected, the N being greater than or equal to 2, wherein the capacitance detection circuit comprises: a reference capacitor, at least N−1 first front end circuits for converting capacitance signals of the capacitors to be detected into first voltage signals and performing differencing on the first voltage signals, at least one second front end circuit for converting capacitance signals of a capacitor to be detected and the reference capacitor into second voltage signals and performing differencing on the second voltage signals, and a processing circuit, wherein:

each of the at least N−1 first front end circuits comprises a first input end and a second input end, and each of the at least one second front end circuit comprises a third input end and a fourth input end;

a first input end and a second input end of each of at least N−2 first front end circuits are respectively connected to two different capacitors to be detected;

a first input end of a first front end circuit except the at least N−2 first front end circuits is simultaneously connected to a third input end of a second front end circuit and a capacitor to be detected, a second input end of the first front end circuit except the at least N−2 first front end circuits is simultaneously connected to a first input end of a first front end circuit of the at least N−2 first front end circuits and a capacitor to be detected, and the capacitors to be detected to which the two input ends of the first front end circuit except the at least N−2 first front end circuits are connected are different capacitors to be detected;

a third input end of each of the at least one second front end circuit is connected to a capacitor to be detected, and a fourth input end of each of the at least one second front end circuit is connected to the reference capacitor, the other end of the reference capacitor is connected to ground;

each of the at least N−1 first front end circuits outputs a first differential signal of voltages corresponding to two connected capacitors to be detected;

each of the at least one second front end circuit outputs a second differential signal of voltages corresponding to a connected capacitor to be detected and connected the reference capacitor; and the processing circuit is connected to output ends of each of the first front end circuits and each of the second front end circuits, and is configured to determine, according to the first differential signal output by each of the first front end circuits and the second differential signal output by each of the second front end circuits, a capacitance value of each of the N capacitors to be detected.

2. The circuit according to claim 1, wherein one of the first front end circuits comprises a first control circuit and a first programmable gain amplifier (PGA) circuit, wherein:

the first control circuit is connected to a DC voltage source, two capacitors to be detected to which the first front end circuit is connected, and the first PGA circuit;

the first control circuit is configured to control the DC voltage source to charge the two capacitors to be detected to which the first front end circuit is connected, and control discharge of the two capacitors to be detected to which the first front end circuit is connected; and the first PGA circuit is configured to convert, when the two capacitors to be detected to which the first front end circuit is connected discharge, capacitance signals of the capacitors to be detected into first voltage signals, and perform differencing on the first voltage signals of the two connected capacitors to be detected, to obtain a first differential signal of voltages corresponding to the two capacitors to be detected to which the first front end circuit is connected;

or one of the first front end circuits comprises a first conversion circuit and a second PGA circuit, wherein the first conversion circuit is connected to a driving voltage source, two capacitors to be detected to which the first front end circuit is connected, and the second PGA circuit;

the first conversion circuit is configured to convert capacitance signals of the two capacitors to be detected to which the first front end circuit is connected into first voltage signals; and the second PGA circuit is configured to acquire, from the first conversion circuit, the first voltage signals corresponding to the two capacitors to be detected to which the first front end circuit is connected, and perform differencing on the first voltage signals of the two connected capacitors to be detected, to obtain a first differential signal of voltages corresponding to the two capacitors to be detected to which the first front end circuit is connected.

3. The circuit according to claim 2, wherein the first control circuit comprises a first switch group and a second switch group, the first switch group is connected to the DC voltage source and the two capacitors to be detected to which the first front end circuit is connected, and the second switch group is connected to the two capacitors to be detected to which the first front end circuit is connected and the first PGA circuit, wherein:

when the first switch group is in a closed state and the second switch group is in an open state, the DC voltage source charges the two capacitors to be detected to which the first front end circuit is connected; and when the second switch group is in a closed state and the first switch group is in an open state, the two capacitors to be detected to which the first front end circuit is connected discharge to the first PGA circuit.

4. The circuit according to claim 2, wherein the first conversion circuit comprises a first voltage division resistor and a second voltage division resistor, wherein:

the first voltage division resistor is connected to the driving voltage source, the second PGA circuit, and one of the two capacitors to be detected to which the first front end circuit is connected; and the second voltage division resistor is connected to the driving voltage source, the second PGA circuit, and the other of the two capacitors to be detected to which the first front end circuit is connected.

5. The circuit according to claim 1, wherein one of the second front end circuits comprises a second control circuit and a third PGA circuit, wherein:

the second control circuit is connected to a DC voltage source, the third PGA circuit, a capacitor to be detected and a reference capacitor to which the second front end circuit is connected;

the second control circuit is configured to control the DC voltage source to charge the capacitor to be detected and the reference capacitor to which the second front end circuit is connected, and control discharge of the capacitor to be detected and the reference capacitor to which the second front end circuit is connected; and the third PGA circuit is configured to convert, when the capacitor to be detected and the reference capacitor to which the second front end circuit is connected discharge, capacitance signals of the capacitor to be detected and the reference capacitor into second voltage signals, and perform differencing on the second voltage signals of the connected capacitor to be detected and the connected reference capacitor, to obtain a second differential signal of voltages corresponding to the capacitor to be detected and the reference capacitor to which the second front end circuit is connected;

or one of the second front end circuits comprises a second conversion circuit and a fourth PGA circuit, wherein the second conversion circuit is connected to a driving voltage source, the fourth PGA circuit, and a capacitor to be detected and a reference capacitor to which the second front end circuit is connected;

the second conversion circuit is configured to convert capacitance values of the capacitor to be detected and the reference capacitor to which the second front end circuit is connected into voltage values; and the fourth PGA circuit is configured to acquire, from the second conversion circuit, second voltage signals corresponding to the capacitor to be detected and the reference capacitor to which the second front end circuit is connected, and perform differencing on the second voltage signals of the connected capacitor to be detected and the connected reference capacitor, to obtain a second differential signal of voltages corresponding to the capacitor to be detected and the reference capacitor to which the second front end circuit is connected.

6. The circuit according to claim 5, wherein the second control circuit comprises a third switch group and a fourth switch group, the third switch group is connected to the DC voltage source and the capacitor to be detected and the reference capacitor to which the second front end circuit is connected, and the fourth switch group is connected to the third PGA circuit and the capacitor to be detected and the reference capacitor to which the second front end circuit is connected, wherein:
- when the third switch group is in a closed state and the fourth switch group is in an open state, the DC voltage source charges the capacitor to be detected and the reference capacitor to which the second front end circuit is connected; and
- when the fourth switch group is in a closed state and the third switch group is in an open state, the capacitor to be detected and the reference capacitor to which the second front end circuit is connected discharge to the third PGA circuit.

7. The circuit according to claim 5, wherein the second conversion circuit comprises a third voltage division resistor and a fourth voltage division resistor, wherein:
- the third voltage division resistor is connected to the driving voltage source, the fourth PGA circuit, and the capacitor to be detected to which the second front end circuit is connected; and
- the fourth voltage division resistor is connected to the driving voltage source, the fourth PGA circuit, and the reference capacitor to which the second front end circuit is connected.

8. The circuit according to claim 1, wherein one of the first front end circuits comprises a first filter circuit and/or a first integration circuit, wherein:
- the first filter circuit is configured to filter an interference signal in a first differential signal of voltages corresponding to two connected capacitors to be detected output by the first front end circuit; and
- the first integration circuit is configured to perform integration and amplification processing on the first differential signal of the voltages corresponding to the two connected capacitors to be detected output by the first front end circuit.

9. The circuit according to claim 1, wherein one of the second front end circuits comprises a second filter circuit and/or a second integration circuit, wherein:
- the second filter circuit is configured to filter an interference signal in a second differential signal of voltages corresponding to a connected capacitor to be detected and a connected reference capacitor output by the second front end circuit; and
- the second integration circuit is configured to perform integration and amplification processing on the second differential signal of the voltages corresponding to the connected capacitor to be detected and the connected reference capacitor output by the second front end circuit.

10. A capacitance detection method, applied to a capacitance detection circuit, the method comprising:
- converting, by each of at least N−1 first front end circuits, capacitance signals of two connected capacitors to be detected into first voltage signals, and performing differencing on the first voltage signals of the two connected capacitors to be detected, to obtain a first differential signal of voltages corresponding to the two connected capacitors to be detected, the N being greater than or equal to 2;
- converting, by each of at least one second front end circuit, capacitance signals of a connected capacitor to be detected and a connected reference capacitor into second voltage signals, and performing differencing on the second voltage signal of the connected capacitor to be detected and the second voltage signal of the connected reference capacitor, to obtain a second differential signal of voltages corresponding to the connected capacitor to be detected and the connected reference capacitor; and
- determining, by a processing circuit according to the first differential signal obtained by each of the first front end circuits and the second differential signal obtained by each of the second front end circuits, a capacitance value of each of N capacitors to be detected.

11. The method according to claim 10, wherein the first front end circuit comprises a first control circuit and a first programmable gain amplifier (PGA) circuit, and the first control circuit is connected to a DC voltage source, two capacitors to be detected to which the first front end circuit is connected, and the first PGA circuit;
- the converting, by each of the at least N−1 first front end circuits, the capacitance signals of the two connected capacitors to be detected into the first voltage signals, and performing differencing on the first voltage signals of the two connected capacitors to be detected, to obtain the first differential signal of the voltages corresponding to the two connected capacitors to be detected, comprises:
- controlling, by the first control circuit, the DC voltage source to charge the two capacitors to be detected to which the first front end circuit is connected, and after charging the two capacitors to be detected to which the first front end circuit is connected, controlling discharge of the two capacitors to be detected to which the first front end circuit is connected; and
- converting, by the first PGA circuit, when the two capacitors to be detected to which the first front end circuit is connected discharge, capacitance signals of the capacitors to be detected into first voltage signals, and performing differencing on the first voltage signals of the two connected capacitors to be detected, to obtain a first differential signal of voltages corresponding to the two capacitors to be detected to which the first front end circuit is connected.

12. The method according to claim 11, wherein the first control circuit comprises a first switch group and a second switch group;
- the controlling, by the first control circuit, the DC voltage source to charge the two capacitors to be detected to which the first front end circuit is connected, and after charging the two capacitors to be detected to which the first front end circuit is connected, controlling the discharge of the two capacitors to be detected to which the first front end circuit is connected, comprises:
- when the first switch group is in a closed state and the second switch group is in an open state, the DC voltage source charges the two capacitors to be detected to which the first front end circuit is connected; and
- when the second switch group is in a closed state and the first switch group is in an open state, the two capacitors to be detected to which the first front end circuit is connected discharge to the first PGA circuit.

13. The method according to claim 12, wherein the second front end circuit comprises a second conversion circuit and a fourth PGA circuit, and the second conversion circuit is connected to a driving voltage source, the fourth PGA circuit, and a capacitor to be detected and the reference capacitor to which the second front end circuit is connected;
- the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, comprises:

converting, by the second conversion circuit, capacitance signals of the capacitor to be detected and the reference capacitor to which the second front end circuit is connected into second voltage signals; and acquiring, by the fourth PGA circuit from the second conversion circuit, the second voltage signals corresponding to the capacitor to be detected and the reference capacitor to which the second front end circuit is connected, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

14. The method according to claim 11, wherein the second front end circuit comprises a second conversion circuit and a fourth PGA circuit, and the second conversion circuit is connected to a driving voltage source, the fourth PGA circuit, and a capacitor to be detected and the reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, comprises:

converting, by the second conversion circuit, capacitance signals of the capacitor to be detected and the reference capacitor to which the second front end circuit is connected into second voltage signals; and acquiring, by the fourth PGA circuit from the second conversion circuit, the second voltage signals corresponding to the capacitor to be detected and the reference capacitor to which the second front end circuit is connected, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

15. The method according to claim 10, wherein the first front end circuit comprises a first conversion circuit and a second PGA circuit, and the first conversion circuit is connected to a driving voltage source, two capacitors to be detected to which the first front end circuit is connected, and the second PGA circuit;

the converting, by each of the at least N−1 first front end circuits, the capacitance signals of the two connected capacitors to be detected into the first voltage signals, and performing differencing on the first voltage signals of the two connected capacitors to be detected, to obtain the first differential signal of the voltages corresponding to the two connected capacitors to be detected, comprises:

converting, by the first conversion circuit, capacitance signals of two capacitors to be detected to which the first front end circuit is connected into first voltage signals; and acquiring, by the second PGA circuit from the first conversion circuit, the first voltage signals corresponding to the two capacitors to be detected to which the first front end circuit is connected, and performing differencing on the first voltage signals of the two connected capacitors to be detected, to obtain a first differential signal of voltages corresponding to the two capacitors to be detected to which the first front end circuit is connected.

16. The method according to claim 15, wherein the second front end circuit comprises a second conversion circuit and a fourth PGA circuit, and the second conversion circuit is connected to the driving voltage source, the fourth PGA circuit, and a capacitor to be detected and the reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, comprises:

converting, by the second conversion circuit, capacitance signals of the capacitor to be detected and the reference capacitor to which the second front end circuit is connected into second voltage signals; and acquiring, by the fourth PGA circuit from the second conversion circuit, the second voltage signals corresponding to the capacitor to be detected and the reference capacitor to which the second front end circuit is connected, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

17. The method according to claim 10, wherein the second front end circuit comprises a second control circuit and a third PGA circuit, and the second control circuit is connected to a DC voltage source, the third PGA circuit, a capacitor to be detected and the reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, comprises:

controlling, by the second control circuit, the DC voltage source to charge the capacitor to be detected and the reference capacitor to which the second front end circuit is connected, and after charging the capacitor to be detected and the reference capacitor to which the second front end circuit is connected, controlling discharge of the capacitor to be detected and the reference capacitor to which the second front end circuit is connected; and converting, by the third PGA circuit, when the capacitor to be detected and the reference capacitor to which the second front end circuit is connected discharge, capacitance signals of the connected capacitor to be detected and the connected reference capacitor into second voltage signals, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

18. The method according to claim 17, wherein the second control circuit comprises a third switch group and a fourth switch group;

the controlling, by the second control circuit, the DC voltage source to charge the capacitor to be detected and the reference capacitor to which the second front end circuit is connected, and after charging the capacitor to be detected and the reference capacitor to which the second front end circuit is connected, controlling the discharge of the capacitor to be detected and the reference capacitor to which the second front end circuit is connected, comprises:

when the third switch group is in a closed state and the fourth switch group is in an open state, the DC voltage source charges the capacitor to be detected and the reference capacitor to which the second front end circuit is connected; and when the fourth switch group is in a closed state and the third switch group is in an open state, the capacitor to be detected and the reference capacitor to which the second front end circuit is connected discharge to the third PGA circuit.

19. The method according to claim 10, wherein the second front end circuit comprises a second conversion circuit and a fourth PGA circuit, and the second conversion circuit is connected to a driving voltage source, the fourth PGA circuit, and a capacitor to be detected and the reference capacitor to which the second front end circuit is connected;

the converting, by each of the at least one second front end circuit, the capacitance signals of the connected capacitor to be detected and the connected reference capacitor into the second voltage signals, and performing differencing on the second voltage signal of the connected capacitor to be detected and the second voltage signal of the connected reference capacitor, to obtain the second differential signal of the voltages corresponding to the connected capacitor to be detected and the connected reference capacitor, comprises:

converting, by the second conversion circuit, capacitance signals of the capacitor to be detected and the reference capacitor to which the second front end circuit is connected into second voltage signals; and acquiring, by the fourth PGA circuit from the second conversion circuit, the second voltage signals corresponding to the capacitor to be detected and the reference capacitor to which the second front end circuit is connected, and performing differencing on a second voltage signal of the connected capacitor to be detected and a second voltage signal of the connected reference capacitor, to obtain a second differential signal of voltages corresponding to the capacitor to be detected and the reference capacitor to which the second front end circuit is connected.

20. A touch detection apparatus comprising: a capacitance detection circuit for detecting capacitances of N capacitors to be detected, the N being greater than or equal to 2, wherein the capacitance detection circuit comprises a reference capacitor, at least N−1 first front end circuits for converting capacitance signals of the capacitors to be detected into first voltage signals and performing differencing on the first voltage signals, at least one second front end circuit for converting capacitance signals of a capacitor to be detected and the reference capacitor into second voltage signals and performing differencing on the second voltage signals, and a processing circuit, wherein:

each of the at least N−1 first front end circuits comprises a first input end and a second input end, and each of the at least one second front end circuit comprises a third input end and a fourth input end;

a first input end and a second input end of each of at least N−2 first front end circuits are respectively connected to two different capacitors to be detected;

a first input end of a first front end circuit except the at least N−2 first front end circuits is simultaneously connected to a third input end of a second front end circuit and a capacitor to be detected, a second input end of the first front end circuit except the at least N−2 first front end circuits is simultaneously connected to a first input end of a first front end circuit of the at least N−2 first front end circuits and a capacitor to be detected, and the capacitors to be detected to which the two input ends of the first front end circuit except the at least N−2 first front end circuits are connected are different capacitors to be detected;

a third input end of each of the at least one second front end circuit is connected to a capacitor to be detected, and a fourth input end of each of the at least one second front end circuit is connected to the reference capacitor, the other end of the reference capacitor is connected to ground;

each of the at least N−1 first front end circuits outputs a first differential signal of voltages corresponding to two connected capacitors to be detected;

each of the at least one second front end circuit outputs a second differential signal of voltages corresponding to a connected capacitor to be detected and connected the reference capacitor;

the processing circuit is connected to output ends of each of the first front end circuits and each of the second front end circuits, and is configured to determine, according to the first differential signal output by each of the first front end circuits and the second differential signal output by each of the second front end circuits, a capacitance value of each of the N capacitors to be detected; and the touch detection apparatus determines a touch position of a user according to a capacitance value of each of N capacitors to be detected determined by the capacitance detection circuit.

* * * * *